(12) United States Patent
Juengling

(10) Patent No.: US 8,759,889 B2
(45) Date of Patent: *Jun. 24, 2014

(54) SYSTEMS AND DEVICES INCLUDING MULTI-GATE TRANSISTORS AND METHODS OF USING, MAKING, AND OPERATING THE SAME

(71) Applicant: Micron Technology, Inc., Boise, ID (US)

(72) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/891,538

(22) Filed: May 10, 2013

(65) Prior Publication Data

US 2013/0240967 A1  Sep. 19, 2013

Related U.S. Application Data

(60) Division of application No. 13/183,337, filed on Jul. 14, 2011, now Pat. No. 8,450,785, which is a continuation of application No. 12/871,700, filed on Aug. 30, 2010, now Pat. No. 7,981,736, which is a division of application No. 12/052,537, filed on Mar. 20, 2008, now Pat. No. 7,808,042.

(51) Int. Cl.
*H01L 27/108* (2006.01)

(52) U.S. Cl.
USPC ........................................ 257/296

(58) Field of Classification Search
USPC ............. 257/288, 296, 619, 331, E21.24, 257/E21.409, E29.242, E21.602; 438/129, 438/299, 758; 365/185.13, 72, 63
See application file for complete search history.

(56) References Cited

U.S. PATENT DOCUMENTS

| | | | |
|---|---|---|---|
| 3,885,861 A | 5/1975 | Farnsworth et al. |
| 5,160,987 A | 11/1992 | Pricer et al. |
| 5,196,910 A | 3/1993 | Moriuchi et al. |
| 5,661,061 A | 8/1997 | Usuami et al. |
| 5,821,513 A | 10/1998 | O'Hagan et al. |
| 5,858,829 A | 1/1999 | Chen |
| 5,925,918 A | 7/1999 | Wu et al. |
| 5,949,057 A | 9/1999 | Feng |
| 6,008,513 A | 12/1999 | Chen |

(Continued)

FOREIGN PATENT DOCUMENTS

| DE | 19946719 | 4/2001 |
|---|---|---|
| JP | 2006054431 | 2/2006 |

(Continued)

OTHER PUBLICATIONS

U.S. Appl. No. 12/033,768, filed Feb. 19, 2008, Werner Juengling.

(Continued)

*Primary Examiner* — Whitney T Moore
(74) *Attorney, Agent, or Firm* — Fletcher Yoder, P.C.

(57) ABSTRACT

Disclosed are methods of forming transistors. In one embodiment, the transistors are formed by forming a plurality of elliptical bases in a substrate and forming fins form the elliptical bases. The transistors are formed within the fin such that they may be used as access devices in a memory array.

25 Claims, 23 Drawing Sheets

(56) References Cited

U.S. PATENT DOCUMENTS

| | | | |
|---|---|---|---|
| 6,043,562 A | 3/2000 | Keeth | |
| 6,081,008 A | 6/2000 | Rostoker | |
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,432,769 B1 | 8/2002 | Fukuda et al. | |
| 6,440,792 B1 | 8/2002 | Shiao et al. | |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,091,543 B2 | 8/2006 | Tzeng et al. | |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,190,060 B1 | 3/2007 | Chiang | |
| 7,195,995 B2 | 3/2007 | Mouli | |
| 7,205,606 B2 | 4/2007 | Tran | |
| 7,345,937 B2 | 3/2008 | Yoon et al. | |
| 2001/0003034 A1 | 6/2001 | Furukawa et al. | |
| 2002/0155656 A1 | 10/2002 | Hayano et al. | |
| 2003/0168676 A1 | 9/2003 | Itabashi et al. | |
| 2003/0198073 A1 | 10/2003 | Keeth | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0125636 A1 | 7/2004 | Kurjanowicz et al. | |
| 2004/0202027 A1 | 10/2004 | Kuzmenka et al. | |
| 2005/0133852 A1 | 6/2005 | Shau | |
| 2005/0151206 A1 | 7/2005 | Schwerin | |
| 2005/0196918 A1 | 9/2005 | Schwerin | |
| 2005/0245024 A1 | 11/2005 | von Schwerin | |
| 2006/0006446 A1 | 1/2006 | Schwerin | |
| 2006/0046407 A1* | 3/2006 | Juengling | 438/301 |
| 2006/0057814 A1 | 3/2006 | Weis | |
| 2006/0073662 A1 | 4/2006 | Jang et al. | |
| 2006/0076602 A1 | 4/2006 | Harter et al. | |
| 2006/0131651 A1 | 6/2006 | Sato et al. | |
| 2006/0244106 A1 | 11/2006 | Morikado | |
| 2006/0246607 A1 | 11/2006 | Fazan et al. | |
| 2006/0270151 A1 | 11/2006 | Lee | |
| 2006/0273415 A1 | 12/2006 | Kim | |
| 2006/0281250 A1 | 12/2006 | Schloesser | |
| 2007/0010058 A1 | 1/2007 | Juengling | |
| 2007/0023805 A1 | 2/2007 | Wells et al. | |
| 2007/0052040 A1 | 3/2007 | Schwerin | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0262375 A1 | 11/2007 | Juengling | |

FOREIGN PATENT DOCUMENTS

| | | |
|---|---|---|
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

U.S. Appl. No. 12/033,780, filed Feb. 19, 2008, Werner Juengling.
U.S. Appl. No. 12/033,799, filed Feb. 19, 2008, Werner Juengling.
U.S. Appl. No. 12/043,813, filed Mar. 6, 2008, Werner Juengling.
U.S. Appl. No. 12/052,300, filed Mar. 20, 2008, Werner Juengling.
U.S. Appl. No. 12/052,317, filed Mar. 20, 2008, Werner Juengling.
U.S. Appl. No. 12/052,537, filed Mar. 20, 2008, Werner Juengling.
U.S. Appl. No. 12/062,354, filed Apr. 3, 2008, Werner Juengling.
U.S. Appl. No. 12/130,825, filed May 30, 2008, Werner Juengling.
Betty Prince, Ph.D.; "Trends in Scaled and Nanotechnology Memories"; Memory Strategies International; Leander, Texas; 2005.
Branislav Curanovic; "Development of a Fully-Depleted Thin-Body FinFET Process"; Department of Microelectronic Engineering, College of Engineering; Rochester Institute of Technology; Rochester, New York; Nov. 2003.
Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.
Enrico Gili; "Fabrication of Vertical MOSFETs With Reduced Parasitics and Suppression of Short Channel Effects"; Department of Electronics and Computer Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.
pdf+dram+fins+%22process+flow%22+%22vertical+access%22.
F. Fishburn, et al.; "A 78nm 6F2 DRAM Technology for Multigigabit Densities".
J. Sturm, et al.; "Increased Transconductance in Fully-Depleted Ultra-Thin Silicon-on-Insulator MOSFETs"; 6 pages.
J.H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique". IEEE International Solid-State Circuits Conference, ISSCC 2004 / Session 2 / Non-Volatile Memory / 2.2, 2004.
R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.
T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.
Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.
Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.
Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.
Endoh, T., Shinmei, K., Sakuraba, H., Masuoka, F.; New Three-Dimensional Memory Array Architecture for Future Ultrahigh-Density DRAM; Res. Inst. of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.
Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

(56) References Cited

OTHER PUBLICATIONS

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFets Architecture Featuring Partially-Insulating Technique for DRAM Cell Application of 40nm Generation and Beyond; http://ieeexplore.ieee.org/xpl/freeabs_all.jsp?arnumber=4154360.

* cited by examiner

SYSTEMS AND DEVICES INCLUDING MULTI-GATE TRANSISTORS AND METHODS OF USING, MAKING, AND OPERATING THE SAME

CROSS-REFERENCE TO RELATED APPLICATION

This application is a divisional of Ser. No. 13/183,337, which was filed on Jul. 14, 2011, which is a continuation of U.S. patent application Ser. No. 12/871,700, which was filed on Aug. 30, 2010, now U.S. Pat. No. 7,981,736, which issued on Jul. 19, 2011, which is a divisional of U.S. patent application Ser. No. 12/052,537, which was filed on Mar. 20, 2008, now U.S. Pat. No. 7,808,042, which issued on Oct. 5, 2010.

BACKGROUND

1. Field of Invention

Embodiments of the present invention relate generally to electronic devices and, more specifically, in certain embodiments, to fin field-effect transistors.

2. Description of Related Art

Fin field-effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

Conventional finFETs are difficult to manufacture as integrated circuits. Typically, manufacturers strive to make the finFETs as small as possible either to increase the number of chips constructed per manufacturing run or to increase the functionality of each chip by increasing the number of finFETs in it. Some conventional finFETs, however, exhibit lower yields when scaled below certain sizes because it is difficult to align photolithography equipment to the small structures. This challenge is aggravated by the number of photolithography steps involved in the manufacture of some conventional devices. For instance, some finFETs are formed with three or more photolithography steps, and each step introduces another opportunity to misalign the photo-mask.

DETAILED DESCRIPTION

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the problems discussed above may be mitigated by certain embodiments of a new manufacturing process. These embodiments, described below, construct a finFET with two photolithography steps: one to define generally elliptical areas, and another to section the generally elliptical areas in rows, thereby defining fins. Reducing the number of photolithography steps from three or more to two reduces the number of alignment steps, and this is believed to potentially increase the yield of the manufacturing process. Further, because the second photolithography step aligns to ellipses rather than circles, the alignment margin is increased in the direction of the major axis of the ellipses, thereby potentially further increasing the yield.

Not all of the embodiments described below address the problems discussed above, and some may address other issues with conventional finFETs. For example, some embodiments produce finFETs arranged with their sources or their drains generally positioned along a straight line. As a result, in some embodiments, a generally straight conductor can connect directly to each of the sources or drains along the line. This is believed to decrease the impedance of the conductor relative to a conductor that undulates to reach each source or drain. In another example, some embodiments described below isolate the finFETs from one another by a relatively deep trench. In some conventional devices, the finFETs are only partially surrounded by the deepest trench used in their manufacture, so the finFETs may be isolated from some adjacent finFETs better than others. As explained below, some embodiments of the present process form finFETs that are substantially or entirely surrounded by the deepest trench used in their manufacture. As a result, some embodiments are believed to isolate the finFETs better than certain conventional devices.

Figure 1:
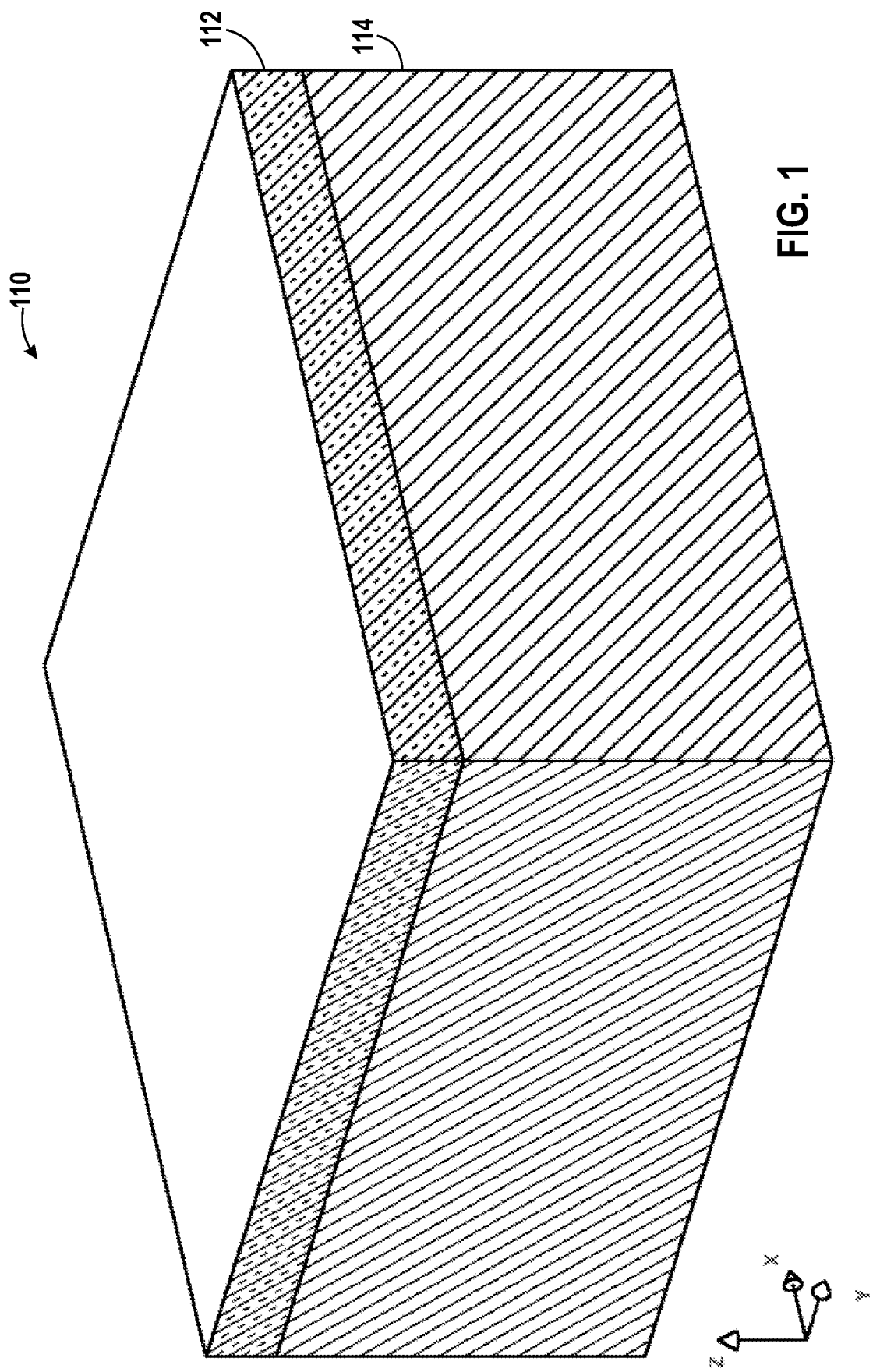
FIGS. 1-23 illustrate an example of a manufacturing process in accordance with an embodiment of the present technique.

As illustrated in FIG. 1, the manufacturing process begins with providing a substrate 110. The substrate 110 may include semiconductive materials such as single crystalline or poly-crystalline silicon, gallium arsenide, indium phosphide, or other materials with semiconductor properties. Alternately, or additionally, the substrate 110 may include a non-semiconductor surface on which an electronic device may be constructed, such as a plastic or ceramic work surface, for example. The substrate 110 may be in the form of an unprocessed whole wafer, a partially processed whole wafer, a fully processed whole wafer, a portion of a diced wafer, or a portion of a diced wafer in a packaged electronic device, for instance.

The substrate 110 may include an upper doped layer 112 and a lower doped layer 114. The upper doped layer 112 and the lower doped layer 114 may be differently doped. For example, the upper doped layer 112 may be an N+ material and the lower doped layer 114 may be a P-material. The depth of the upper doped layer 112 may be generally uniform over a substantial portion of the substrate 110, such as throughout a substantial portion of an array area of a memory device, for example. The upper doped layer 112 and lower doped layer 114 may be formed by implanting or diffusing dopant materials. Alternatively, or additionally, one or both of these layers 112 and/or 114 may be doped during growth or deposition of all or part of the substrate 110, such as during epitaxial deposition of a semiconductive material or during growth of a semiconductive ingot from which wafers may be cut. As explained below with reference to FIG. 20, after subsequent processing, material from the upper doped layer 112 may form both a source and a drain of a transistor, and material from the lower doped layer 114 may form a channel of a transistor.

Figure 2:
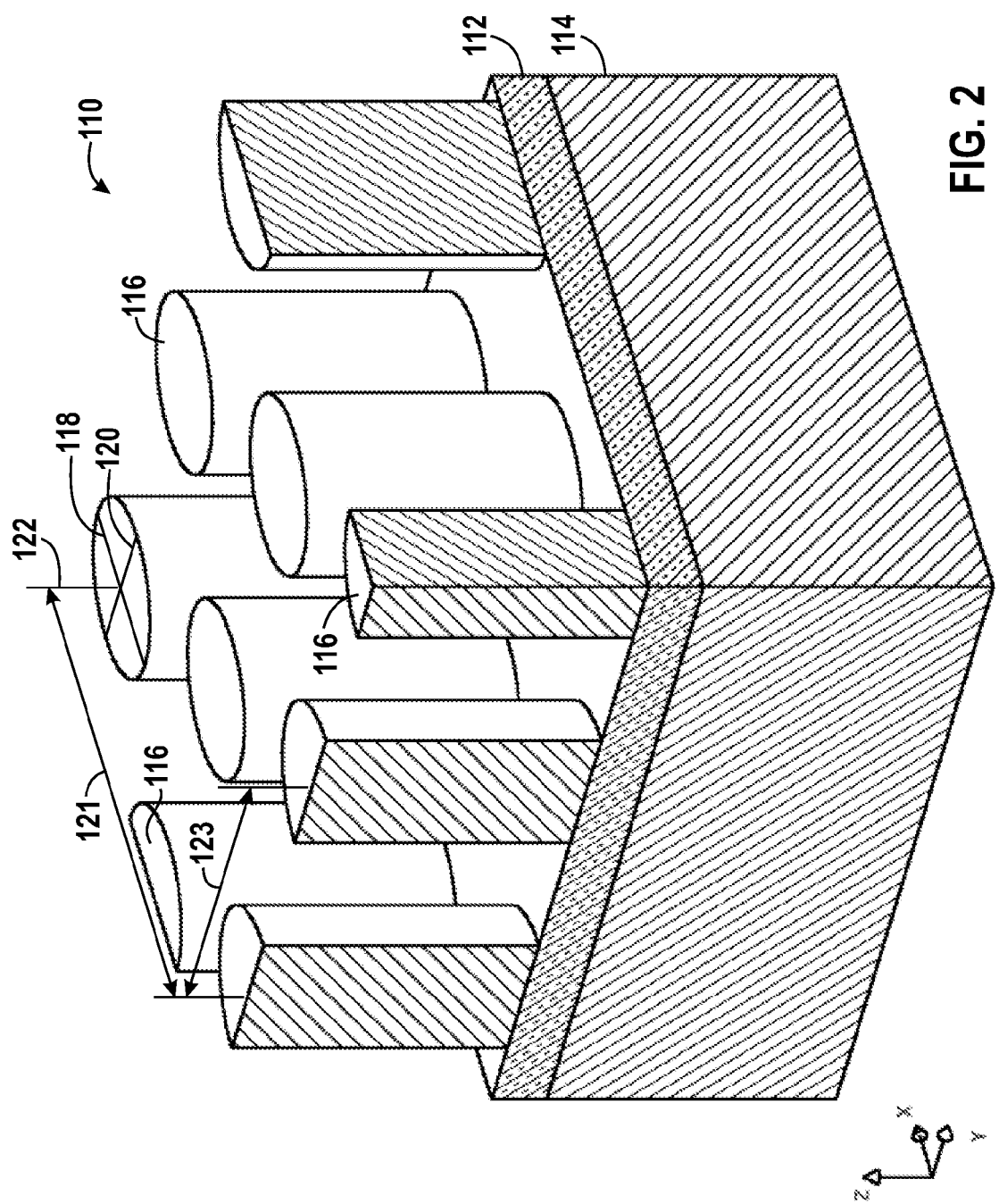

FIG. 2 illustrates the substrate 110 after a mask 116 has been formed on the upper doped layer 112. The illustrated mask 116 includes a plurality of generally right-elliptical cylinders that are generally normal to the surface of the substrate 110. In other embodiments, the mask 116 may define other shapes, such as circles, squares, rectangles, or triangles. In this embodiment, each of the illustrated cylinders of the mask 116 is generally similar or identical to the other cylinders, and each of the cylinders may be characterized by a major axis 118, a minor axis 120, and a central axis 122. In some embodiments, the minor axis may be approximately 1 F, where F is the resolution of the system (e.g., a photolithography system) used to pattern the mask 116, and the major axis 118 is larger than 1 F and may be larger than, less than, or generally equal to 1.5 F, 2 F, 3 F, or 4 F. Other embodiments may include a mask 116 with different shapes, such as certain other elongated shapes, like a rectangle, or non-elongated shapes, like a circle or square. In the illustrated embodiment, the cylinders of the mask 116 are arranged in a hexagonal lattice, with staggered rows, but in other embodiments they may be arranged differently, for example in a square lattice, which has generally aligned rows and columns. The mask 116 may repeat in the direction of the major axis 118 with a period 121, and it may repeat in the direction of the minor axis 120 with a period 123. The mask 116 may be patterned photo-resist, or the mask 116 may be a hard mask formed by depositing a blanket film of oxide, nitride, or other appropriate materials, and selectively etching the blanket film around a mask of patterned photo-resist.

Figure 3:
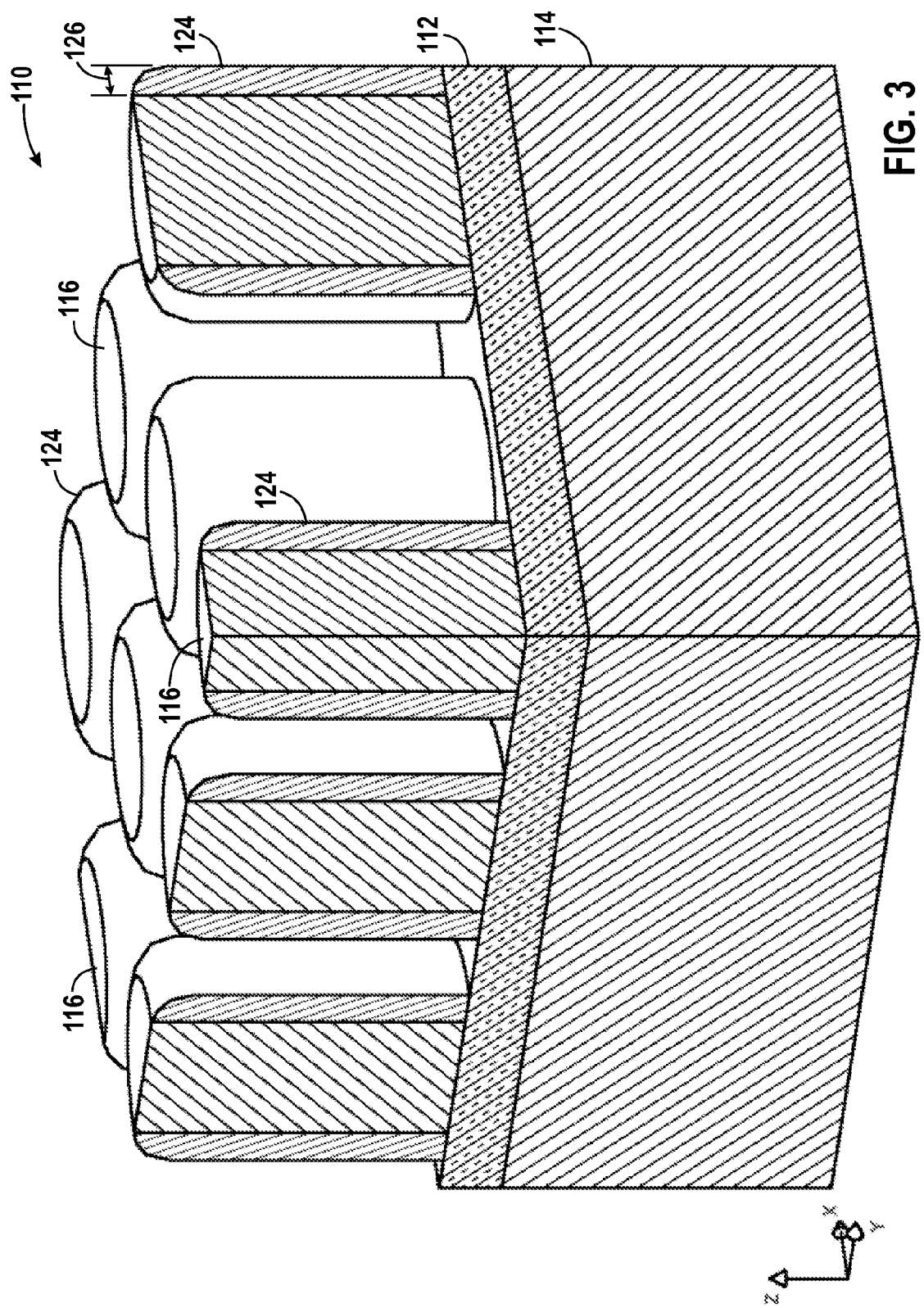

FIG. 3 illustrates the substrate 110 of FIG. 2 after formation of outer side-wall spacers 124. The outer side-wall spacers 124 may be formed by depositing a conformal nitride film (or other appropriate material) by method know in the art, e.g., chemical-vapor deposition, and etching the nitride film with an anisotropic etch, such as a plasma etch. The spacers 124 may have a thickness 126 that is generally equal to or less than 0.35 F, 0.25 F, or 0.15 F, or some other distance, depending on the application. The outer side-wall spacers 124 may be made from a different material than the mask 116 to facilitate selective removal of the mask 116 in a subsequent step.

Figure 4:
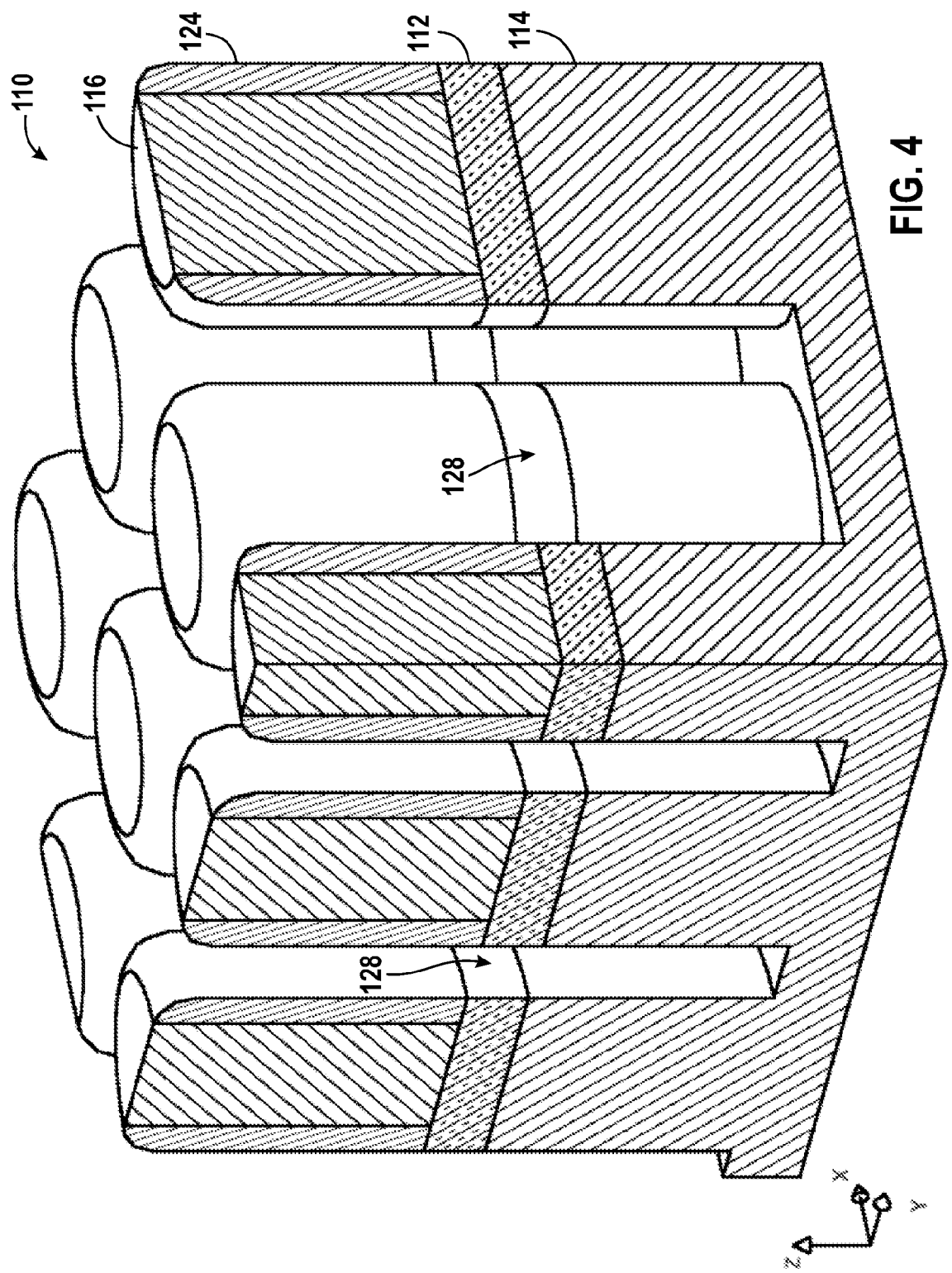

After forming the mask 116 and the outer side-wall spacers 124, the substrate 110 may be etched, using the structures 124 and 116 as a hard mask, to form deep trenches 128, as illustrated by FIG. 4. (The term "deep trenches" distinguishes these trenches from subsequently formed "shallow trenches," and does not necessarily reference some particular depth." The deep trenches 128 may be generally complementary to the outer profile of the outer side-wall spacers 124, and the trenches 128 may extend generally perpendicularly into the substrate 110 relative to the surface of the substrate 110.

Figure 5:
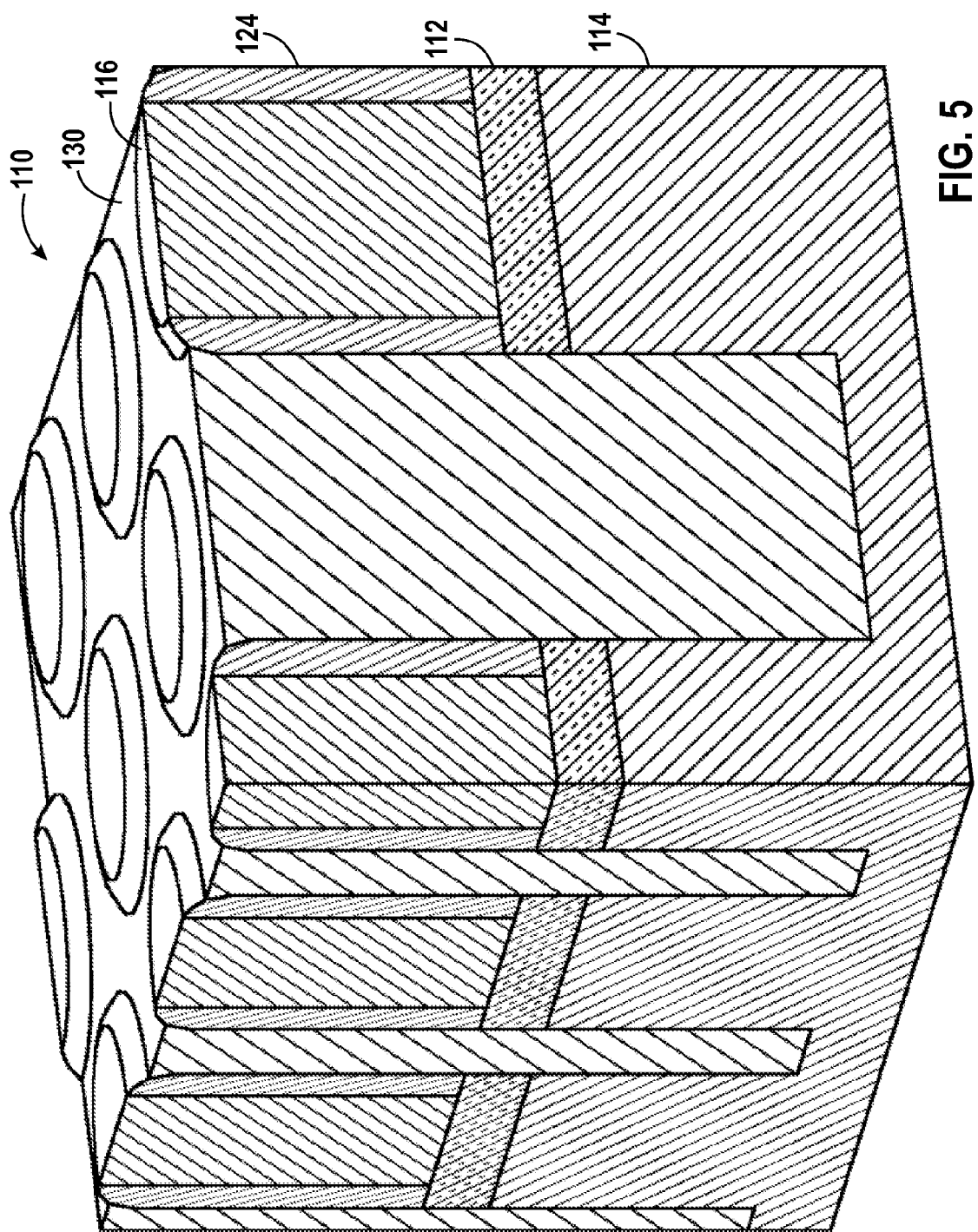

Next, the deep trenches 128 may be filled with a sacrificial material 130, as illustrated by FIG. 5. The sacrificial material 130 may be an oxide, spun on glass (SOG), or other appropriate material that has been deposited and planarized with, for example, chemical mechanical planarization (CMP), or an isotropic etch to remove an overburden.

Figure 6:
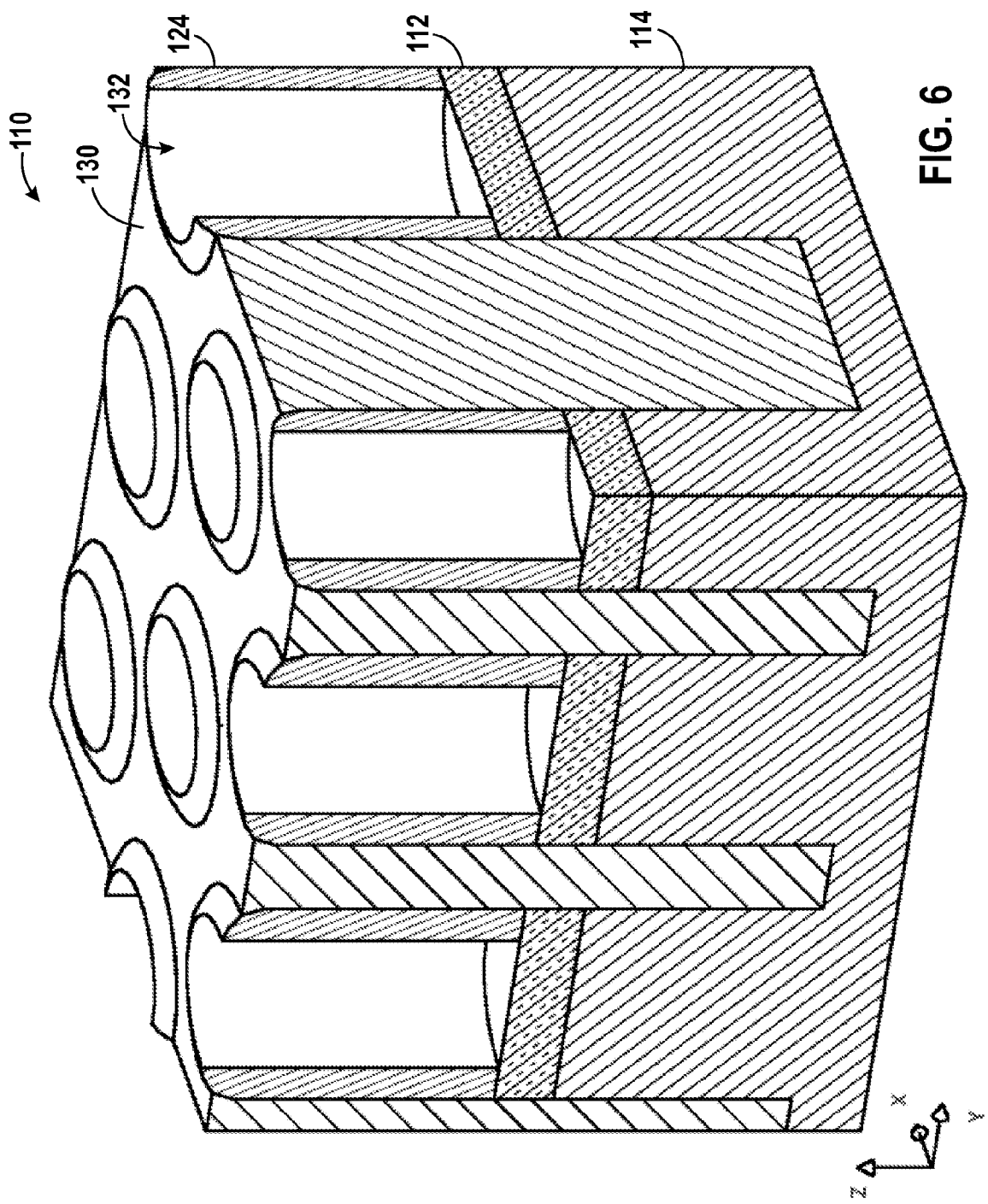

After filling the deep trenches 128 with sacrificial material 130, the mask 116 may be removed, as illustrated by FIG. 6. The mask 116 may be etched with a process that is selective to both the outer side-wall spacers 124 and the sacrificial material 130, so that at least a portion or substantially all of these structures 124 and 130 remain on the substrate 110. The voids 132 left by removing the mask 116 are generally identical to the shape of the mask 116.

Figure 7:
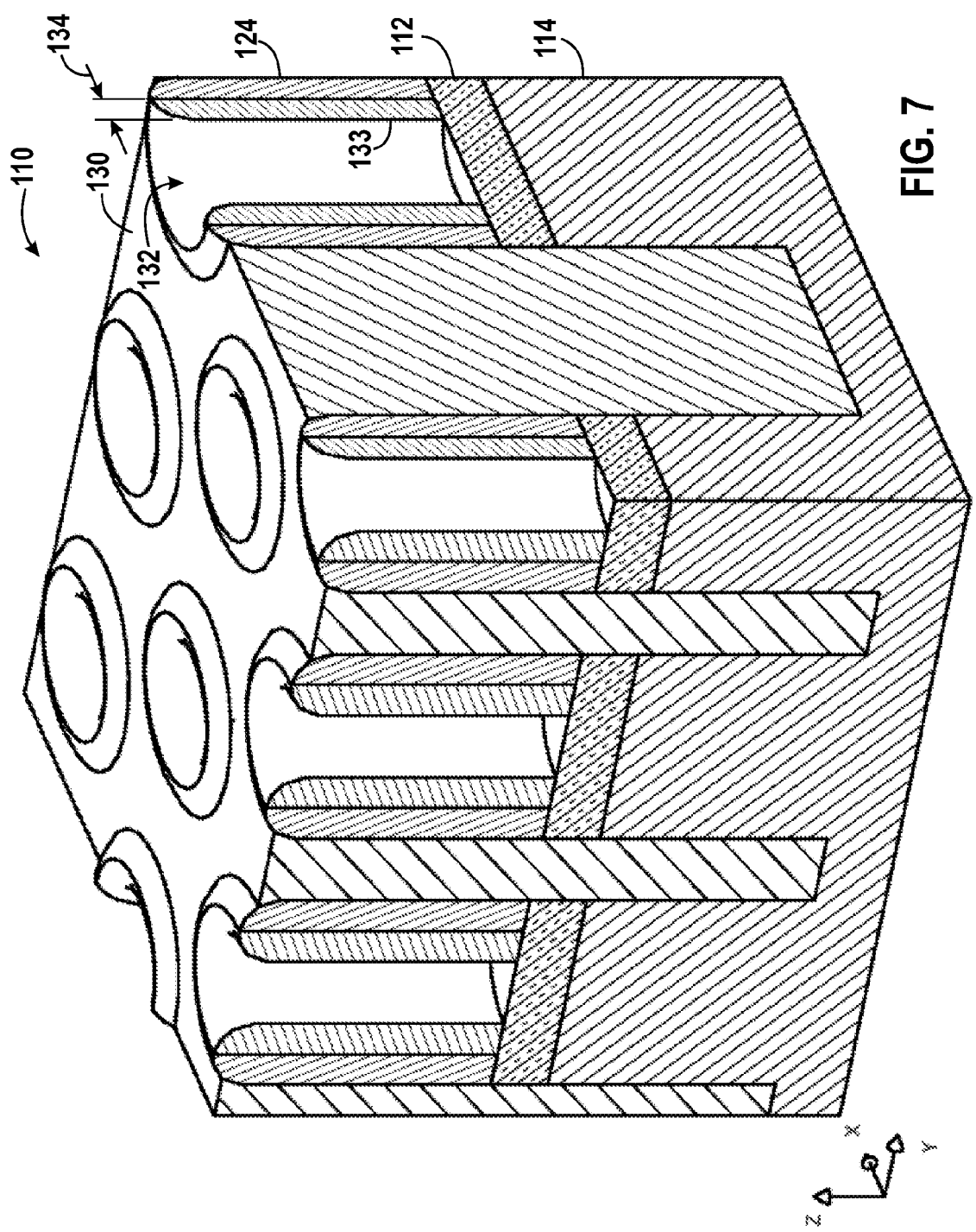

Next in the process, an inner side-wall spacer 133 is formed in the void 132, as illustrated by FIG. 7. The inner side-wall spacer 133 may have a width 134 that is generally equal to or less than 0.35 F, 0.25 F, or 0.15 F, or some other distance, depending on the application. In this embodiment, the inner side-wall spacer 133 is formed by depositing a blanket film, such as a nitride film, and isotropically etching the blanket film to leave the inner side-wall spacer 133 along the walls of the void 132. The inner side-wall spacer 133 may be the same material and have the same width 134 as the outer side-wall spacer 124, or it may be a different material or have a different width.

Figure 8:
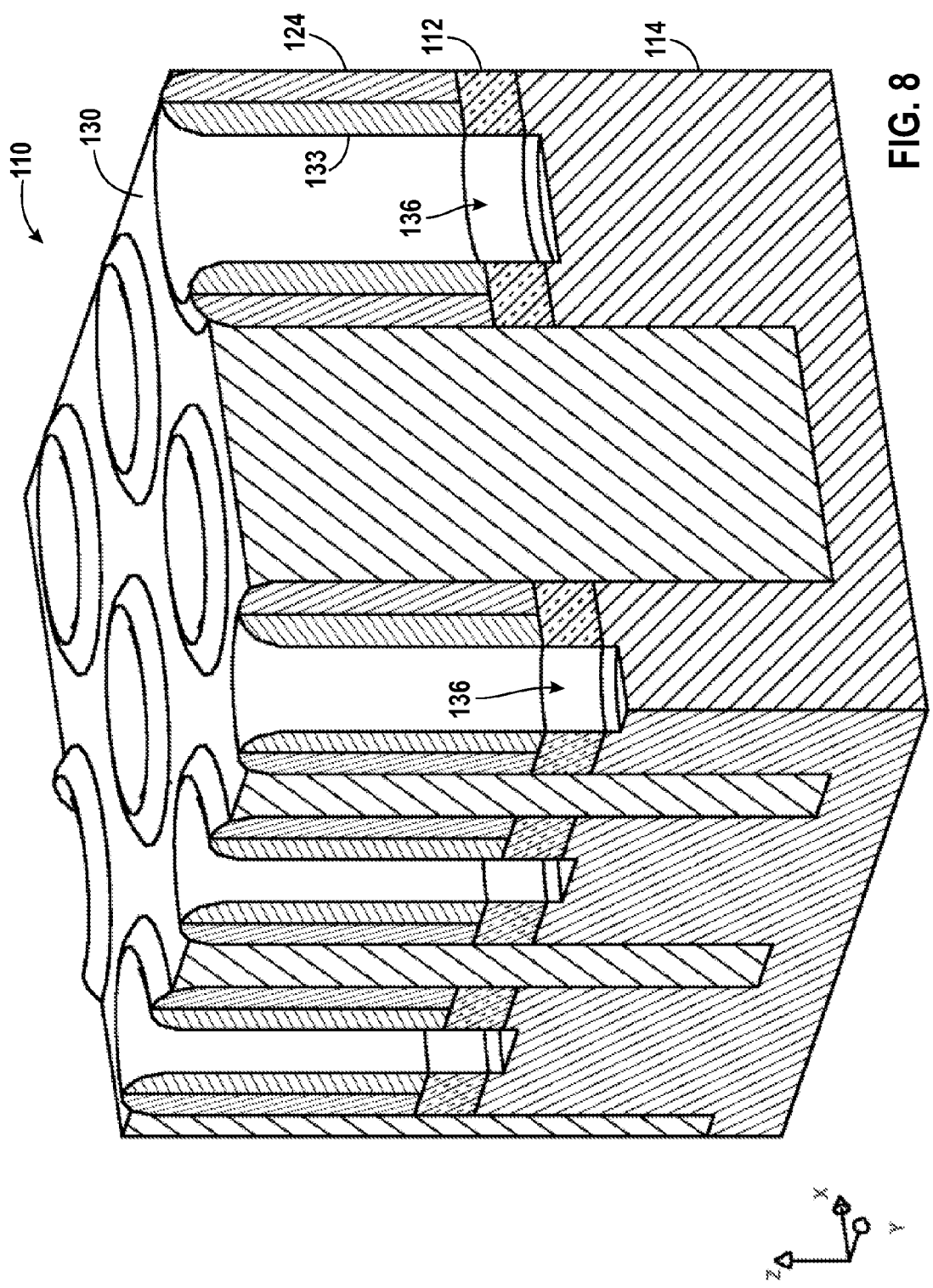

After forming the inner side-wall spacer 133, the substrate 110 may be etched, using the inner side-wall spacer 133 as a hard mask, as illustrated by FIG. 8. This etch may form shallow trenches 136 (which are shallow in the sense that they are not as deep as the deep trenches described above) in the interior of the space defined by the inner side-wall spacer 133. The depth of the shallow trench 136 may be greater than the depth of the upper doped layer 112. Like the deep trench 128, the shallow trench 136 may be etched with an anisotropic plasma etch or other appropriate process.

Figure 9:
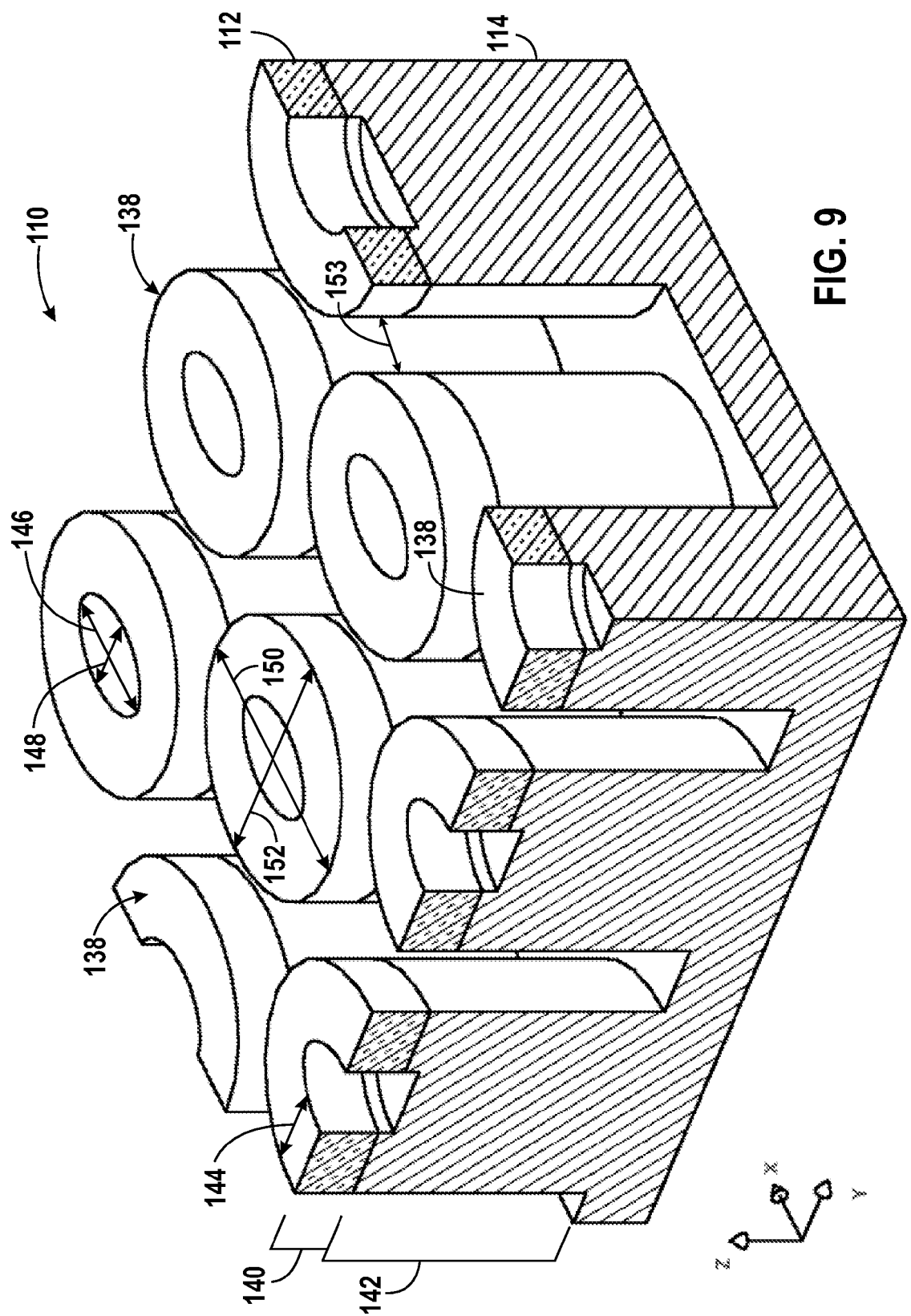

Next, the sacrificial material 130, the inner side-wall spacer 133, and the outer-the side-wall spacer 124 may be removed, as illustrated by FIG. 9. These features 124, 130, and 133 may be removed with a wet etch or other process that is selective to the material that makes up the substrate 110.

As illustrated by FIG. 9, in this embodiment, the deep trench 128 and the shallow trench 136 combine to define a plurality of precursor pillars 138. Both the position and the shape of the precursor pillars 138 may correspond to the position and the shape of the mask 116 (FIG. 1). The precursor pillars 138 may each define a generally right-elliptical cylinder that extends generally perpendicularly from the surface of the substrate 110. In this embodiment, the precursor pillars 138 are not exactly elliptical because the side-wall spacers 124 and 133 added a generally uniform distance around and within the perimeter of the generally elliptical mask 116. The precursor pillars 138 may include a generally elliptical tube 140 disposed on top of a generally elliptical cylinder 142. The distance 144 between the inner side-wall of the tubes 140 and the outer sidewall of the tubes 140 may be approximately equal to or less than 0.7 F, 0.5 F, or 0.3 F, or some other distance. The shape of the interior of the tubes 140 may be characterized by an inner major axis 146 and an inner minor axis 148, and the shape of the pillars 138 may be characterized by an outer major axis 150 and an outer minor axis 152. The distance 153 between precursor pillars 138 in adjacent rows may be approximately equal to or less than 0.7 F, 0.5 F, or 0.3 F, or some other distance, depending on the application.

Figure 10:
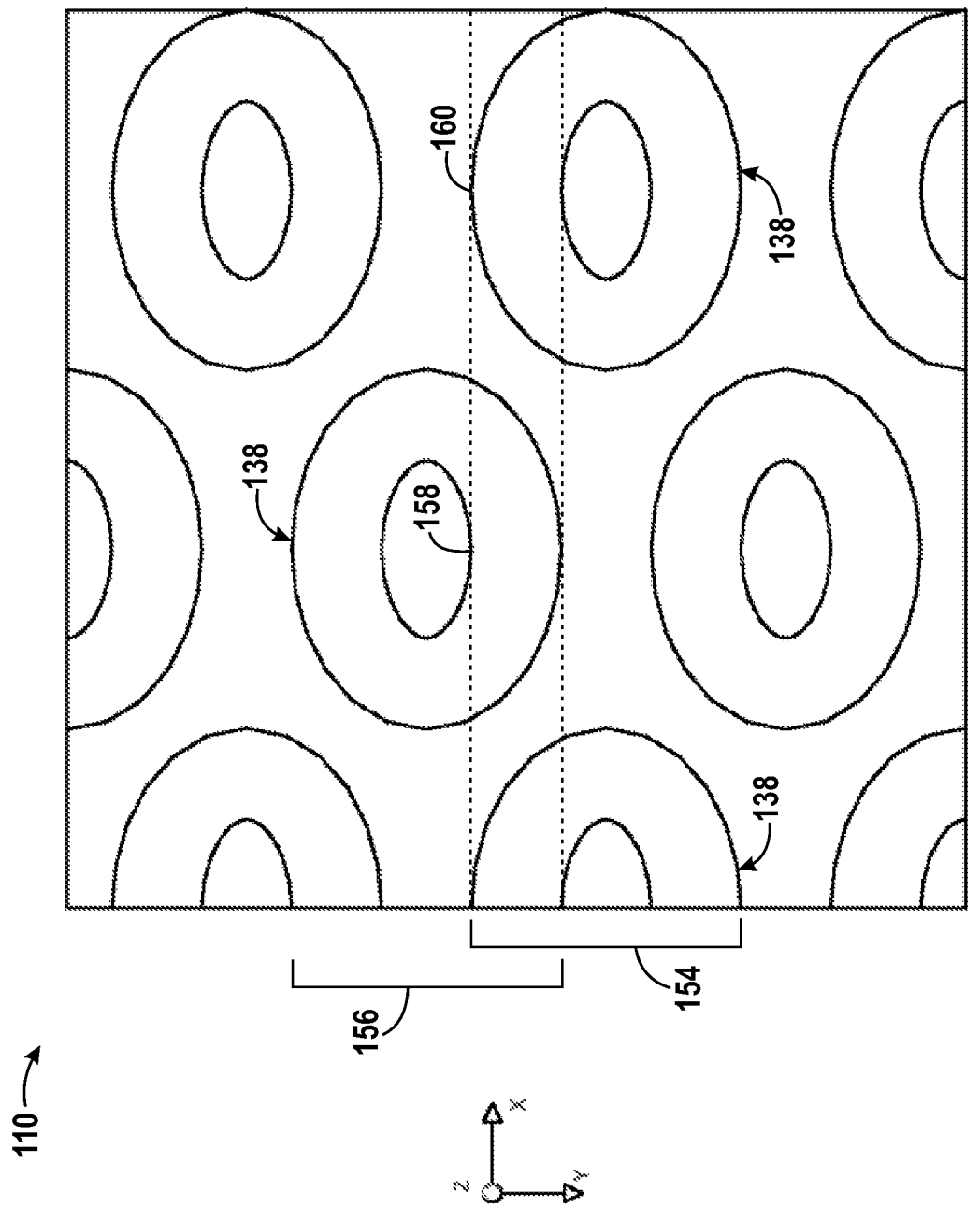

Another aspect of the precursor pillars 138 is illustrated by FIG. 10, which is a top view of the substrate 110. FIG. 10 includes dotted lines that illustrate one way in which the precursor pillars 138 may be aligned. As illustrated, the precursor pillars 138 are positioned such that adjacent sub-columns 154 and 156 overlap one another. The sub-columns 154 and 156, as explained below with reference to FIG. 22, may combine to form a single column of finFETs on alternating sides of a conductor, such as a data line. In this embodiment, inner side-wall 158 is generally aligned with outer sidewall 160, but in other embodiments, the tube portions 140 of the pillars 138 may only partially overlap or may not overlap at all. These overlapping portions of the precursor pillars 138, after subsequent processing, in some embodiments, facilitate generally direct connections from generally straight digit lines to transistors, as explained below.

Figure 11:
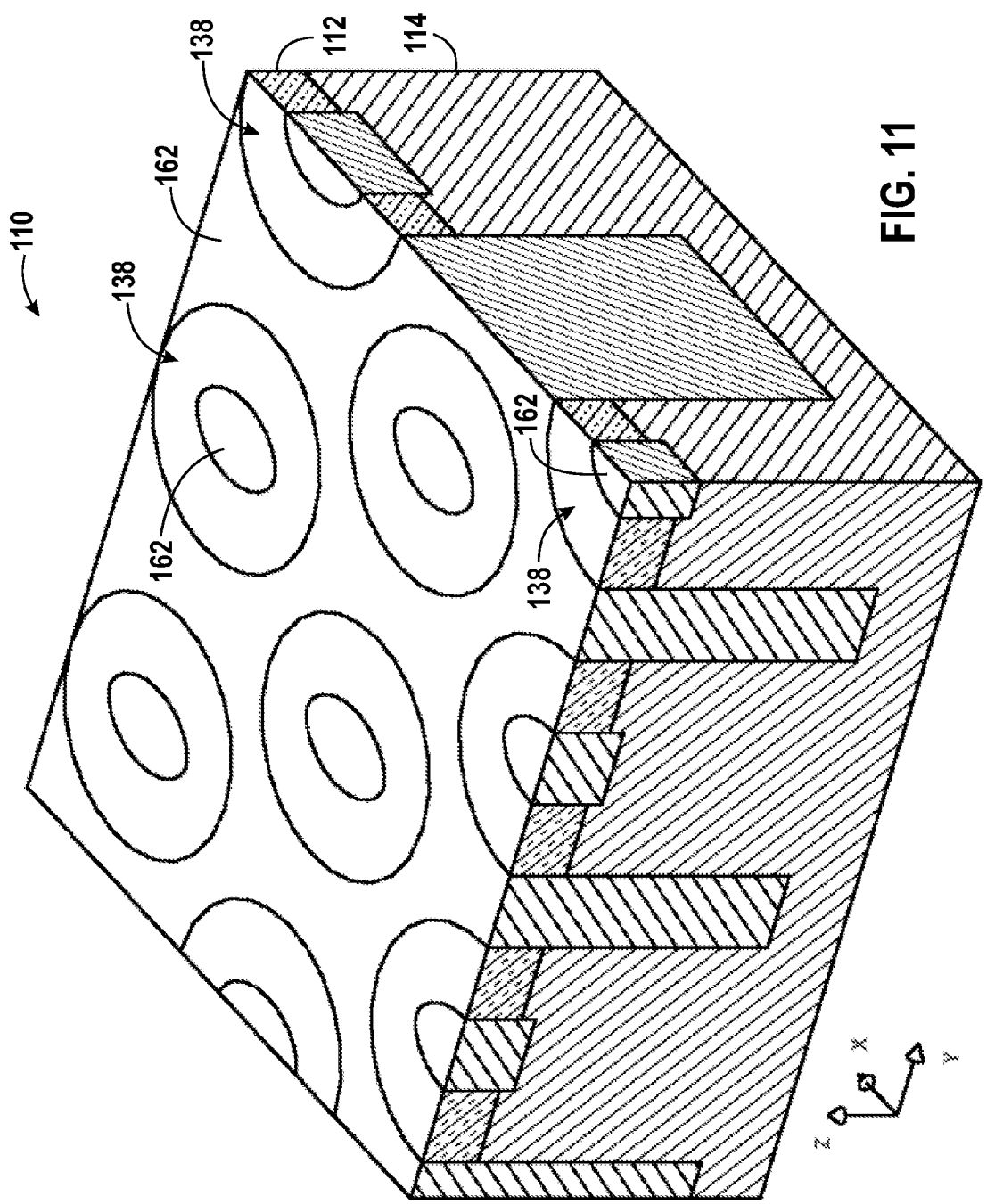

Next, a field dielectric 162 may be formed, as illustrated by FIG. 11. In some embodiments, the field dielectric 162 may be an oxide that is deposited with chemical-vapor deposition or a high density plasma process, or in other embodiments, the field dielectric 162 may be grown by reacting the substrate 110 with oxygen in a furnace or with other techniques known in the art. Some embodiments may retain a portion of the sacrificial material 130 as the field dielectric 162. The field dielectric 162 may substantially or entirely fill both the deep trenches 128 and the shallow trenches 136.

Figure 12:
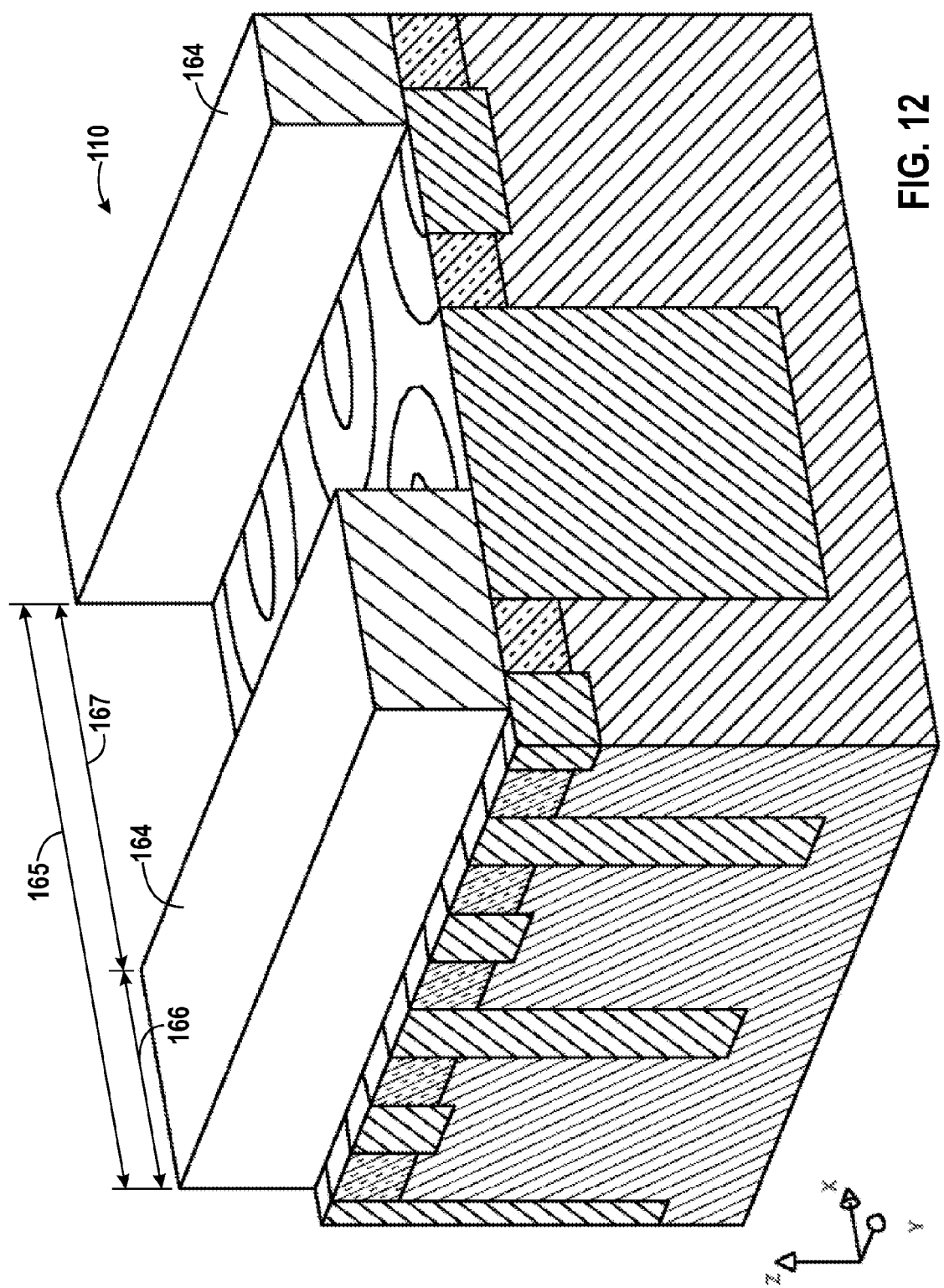
Figure 13:
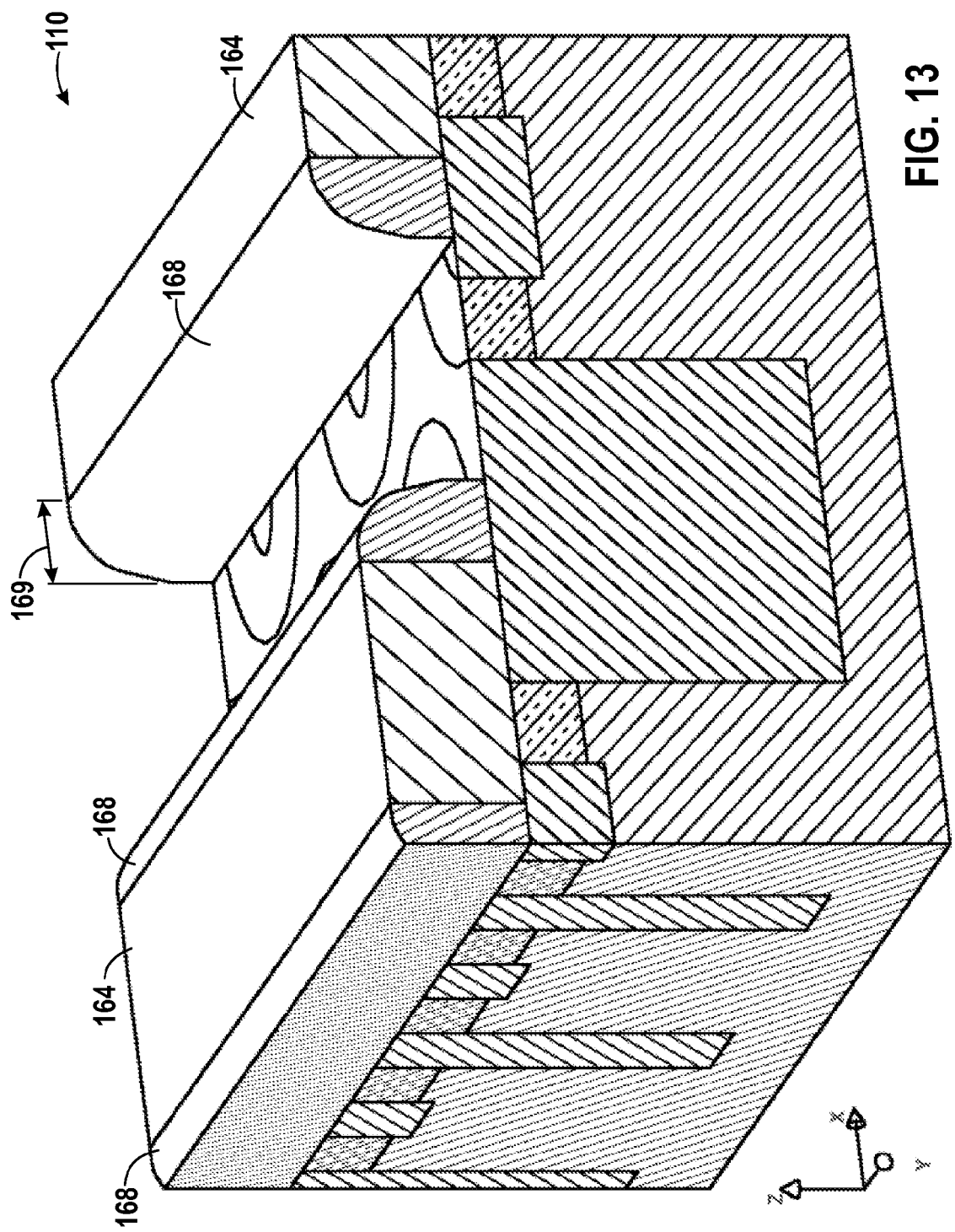
Figure 14:
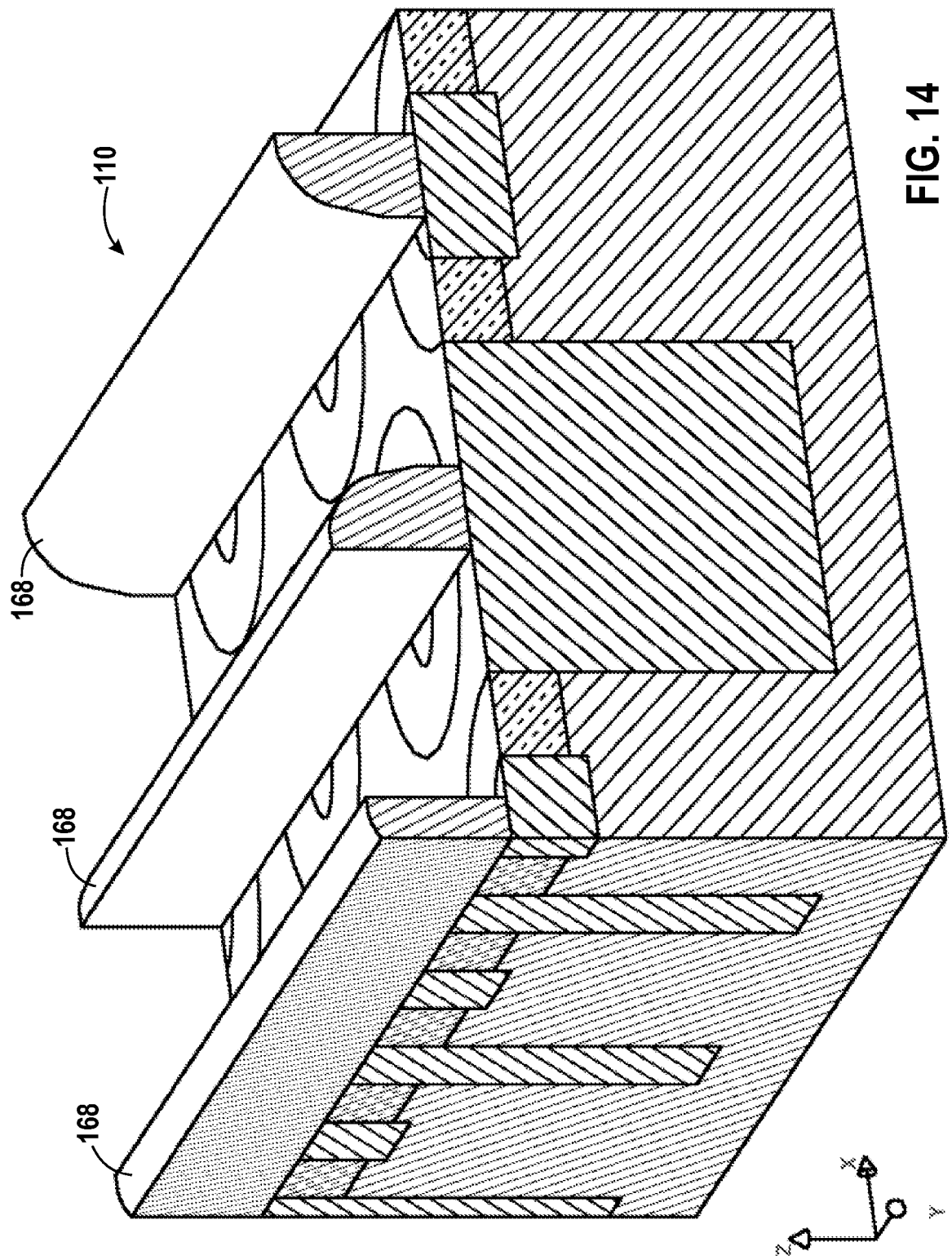
Figure 15:
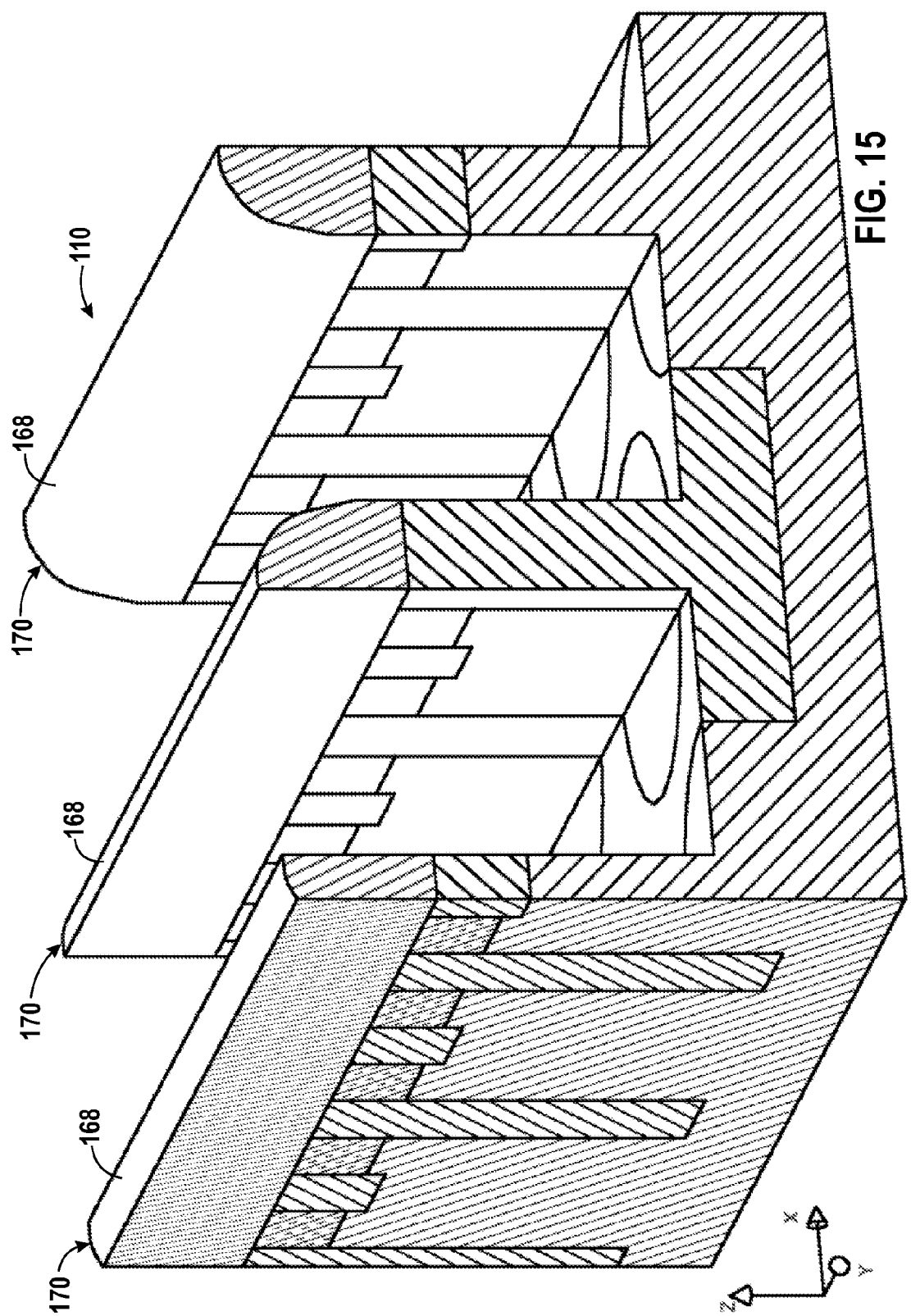
Figure 16:
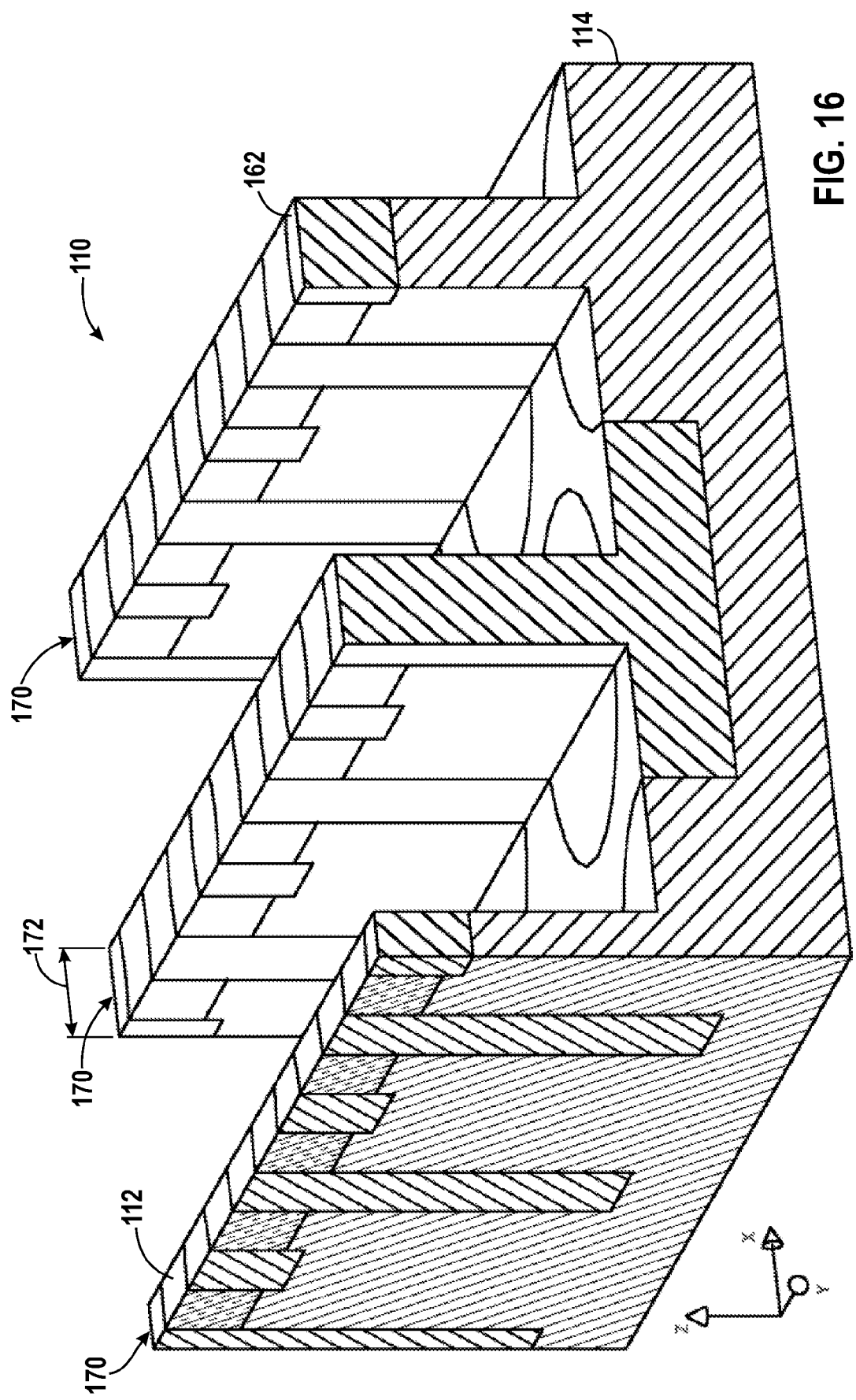
Figure 17:
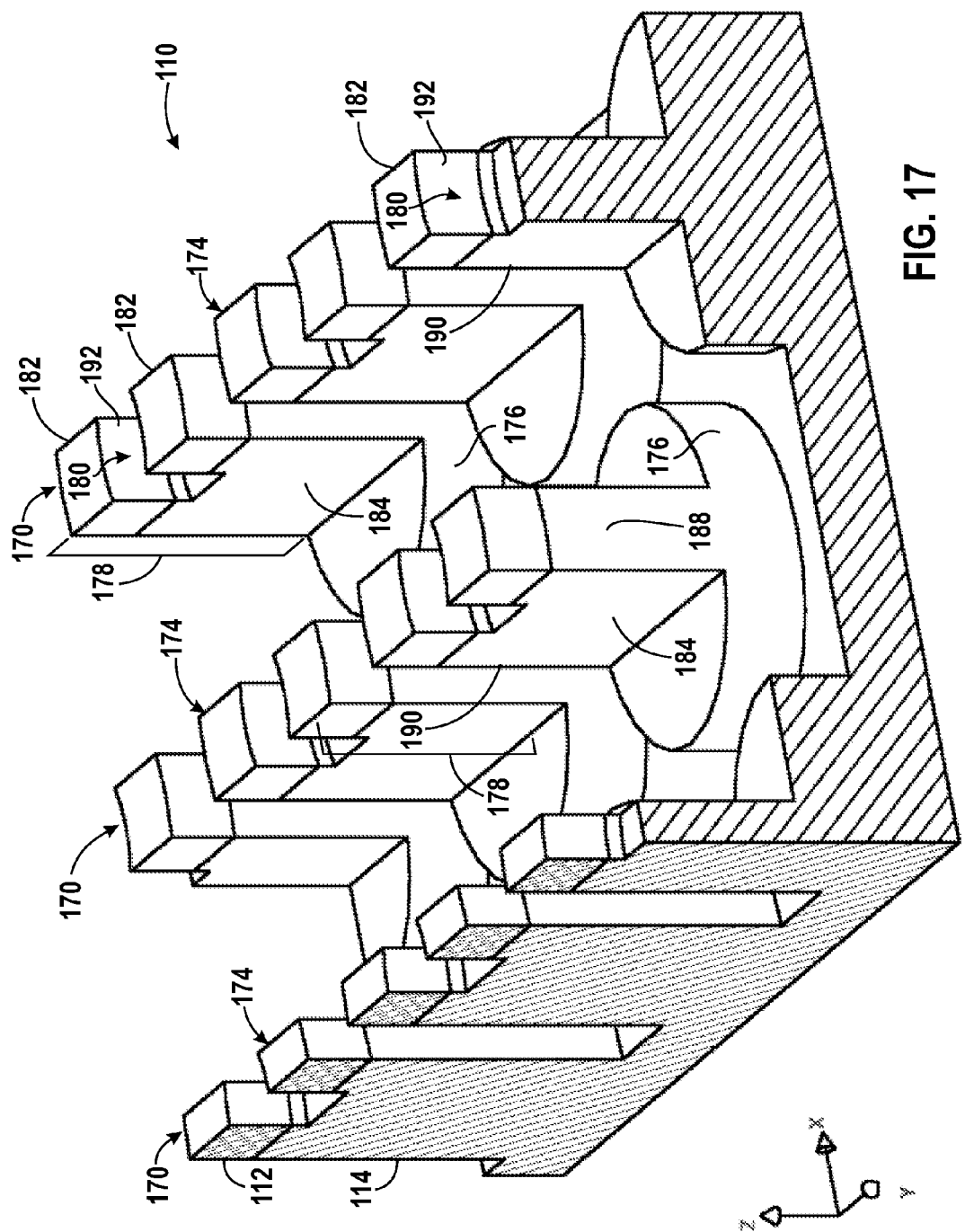

After forming the field dielectric 162, the substrate 110 may be patterned with rows and selectively etched with an intermediate trench etch, as illustrated by FIGS. 12-17. Specifically, FIGS. 12-14 illustrate a process for patterning the rows before an intermediate trench etch, and FIGS. 15-17 illustrate the resulting structures. As illustrated by FIG. 12, a mask 164 may be formed on the substrate 110. The mask 164 may be a hard mask, such as a carbon hard mask or a mask formed by selectively etching lines in a blanket oxide or nitride film, or some other material. The mask 164 may include an open region 167 and an obstructed region 166, and the mask 164 may repeat over a period 165. The size of the period 165 may be generally equal to the period 121 of the mask 116, and the size of the obstructed region 166 may be generally equal to one half the period 165 minus the width 169 of a side-wall spacer 168 formed in the next step and illustrated by FIG. 13.

As illustrated by FIG. 13, the side-wall spacer 168 may be formed on the side walls of the mask 164. The side-wall spacer 168 may be formed by depositing a nitride film, or other appropriate material, on the substrate 110 and etching the film with an anisotropic etch. The etch may etch oxide and silicon at generally the same rate, and it may remove around 1300 to 1700 angstroms of material. The resulting side-wall spacer 168 may have a width 169 at its base that is less than, or approximately equal to 0.25 F, 0.5 F, 1 F, or some other dimension. Further, the side-wall spacer 168 may be generally parallel to the minor axes 120 of the ellipses of the mask 116 (FIG. 2) and generally centered over the central axes 122 of the mask 116 (FIG. 2).

Subsequent to forming the side-wall spacer 168, the mask 164 may be removed with an etch that is selective to the side-wall spacer 168, thereby leaving the side-wall spacer 168 and exposing the portion of the substrate 110 under the mask 164, as illustrated by FIG. 14. Finally, as illustrated by FIG. 15, the substrate 110 may be etched with an anisotropic etch to form rows 170, and the side-wall spacers 166 may be removed, as illustrated by FIG. 16. In other embodiments, the mask 164 is not double-pitched, and the pattern from the mask 164 is used to form rows 170 directly. For example, the mask 164 may be formed, and in some embodiments, its line width adjusted with an etchback, reflow, or other thinning process.

Figure 18:
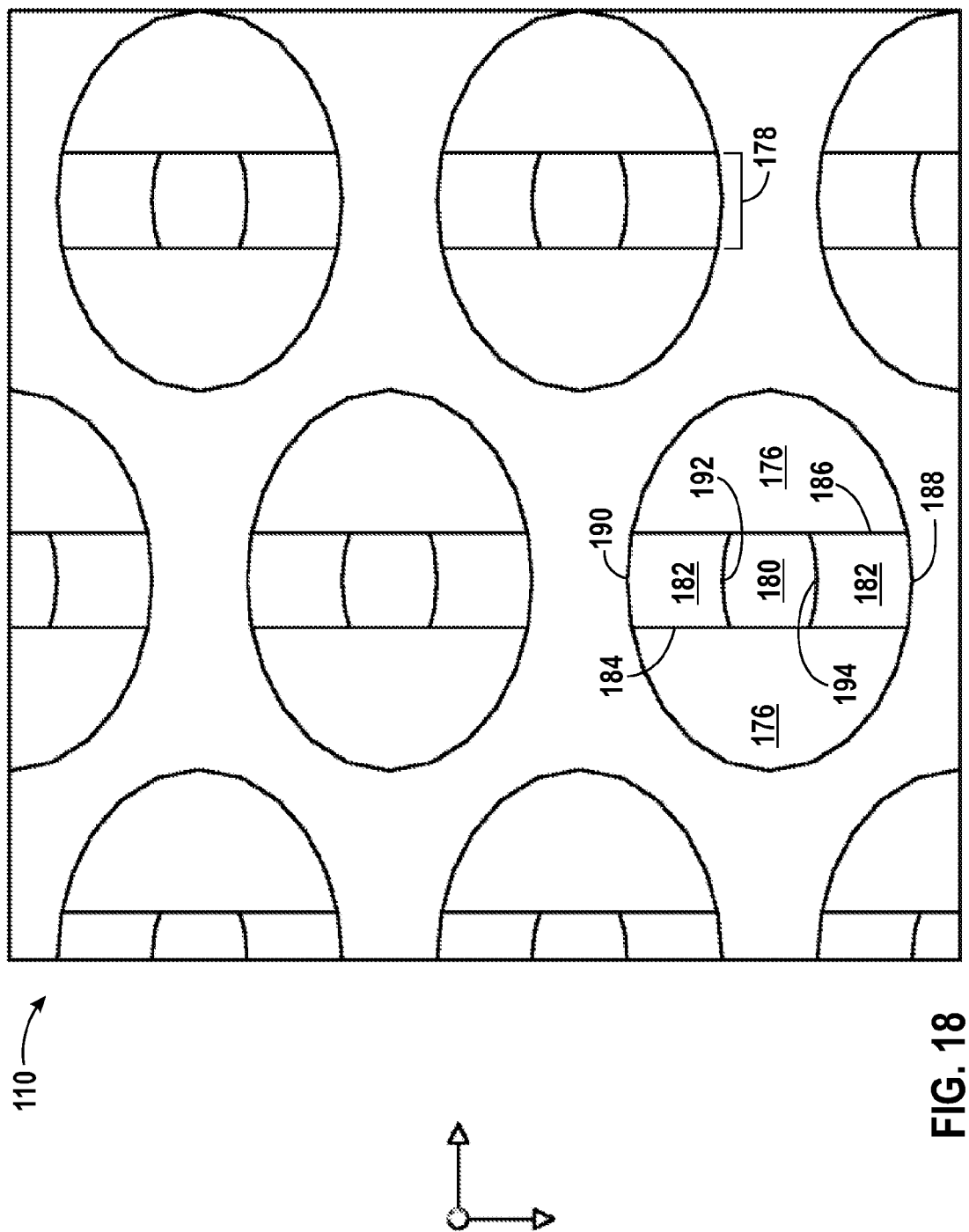

FIGS. 16-18 illustrate various aspects of the rows 170. As with the side-wall spacers 166, the rows 170 in this embodiment are generally straight, generally parallel to the minor axes 120 of the ellipses of the mask 116 (FIG. 2), and generally centered over the central axis 122 of the mask 116 (FIG. 2). The alignment margin for the rows 170 may be increased by the elliptical shape of the mask 164. Because the mask 116 has a generally elliptical shape, the alignment and dimensional tolerances for the mask 164 may be increased in the direction of the major axis 118 (FIG. 2) relative to a mask 116 that has circles. Thus, in some embodiments, the rows 170 may be shifted some distance so that they are not necessarily centered on the central axis 122 of the ellipses. In this embodiment, though, the rows 170 are positioned and sized to generally fall entirely or substantially within the space defined by the generally elliptical shallow trench 136 (FIG. 8).

The rows 170 have a width 172 that may generally correspond to the width 169 of the side-wall spacers 168. The width 172 is generally uniform along the length and height of the illustrated rows 170, but in other embodiments, the rows 170 may taper wider toward their base or have some other shape. Further, in some embodiments, the rows 170 may not be generally straight, e.g., the rows 170 may undulate according to the mask 116.

To depict other aspects of the rows 170, FIG. 17 illustrates the substrate 100 without the field dielectric 162. The substrate 110 includes a plurality of pillars 174 that are formed by removing material from the precursor pillars 138 (FIG. 9). In this embodiment, each of the pillars 174 includes a base 176 that is a generally right-elliptical cylinder extending generally perpendicularly from the substrate 110. Extending from the bases 176, in the present embodiment, are fins 178, each having a gap 180 (e.g., a U-shaped gap) that defines two legs 182. The fins 178 each may have two generally planar walls 184 and 186 and two generally convex-curved side-walls 188 and 190. Additionally, the sides of the gaps 180 include two generally concave-curved side-walls 192 and 194. The curvature of these walls 184, 186, 192, and 194 is illustrated in the top view of FIG. 18. As illustrated by FIG. 17, in this embodiment, the distal portion of the legs 182 are differently doped from the other portions of the pillars 174. As mentioned above with reference to FIG. 1, the substrate 110 includes upper doped layer 112 and lower doped layer 114. In this embodiment, the upper doped layer 112 does not extend below the depth of the gaps 180.

Figure 19:
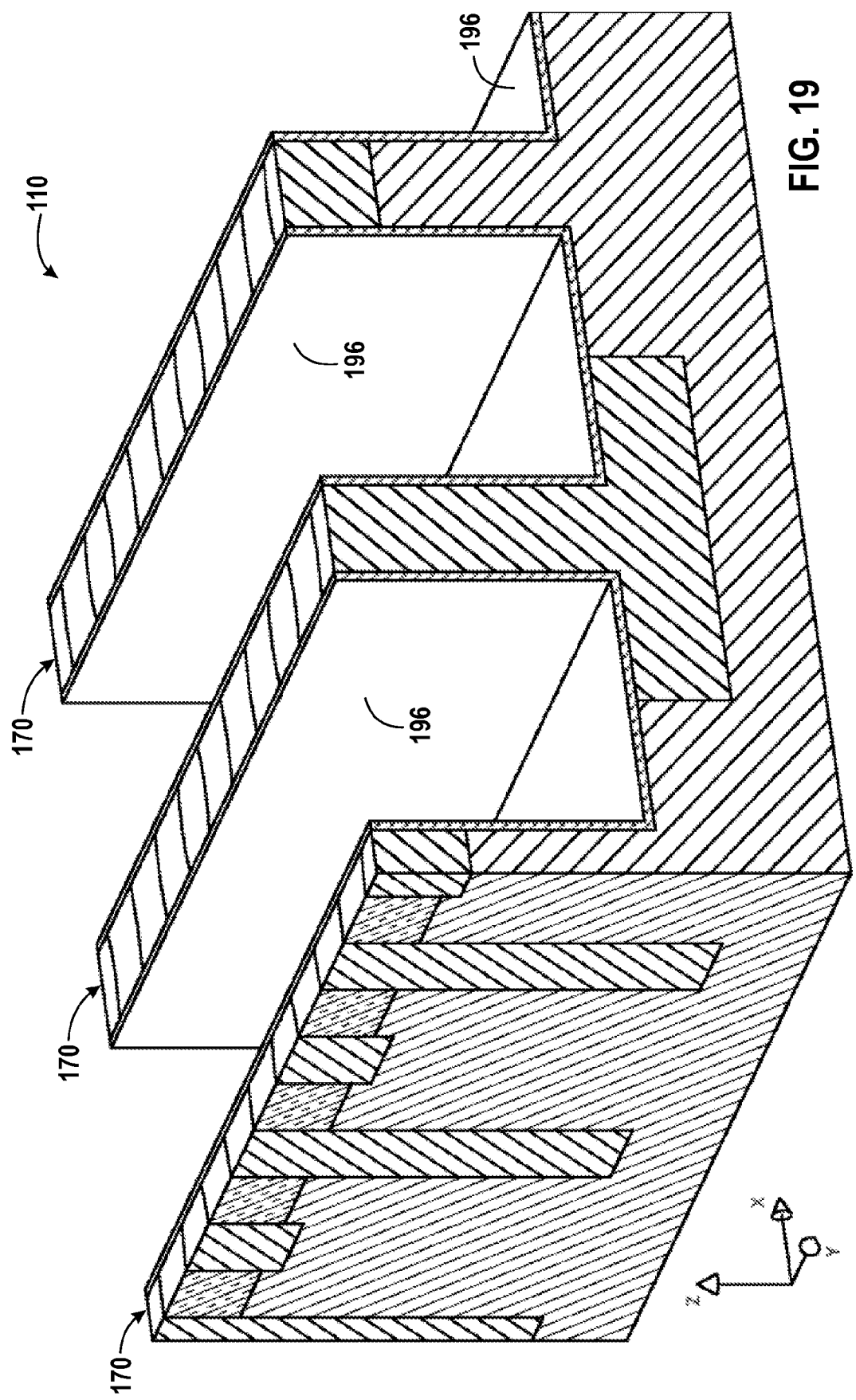

Once the rows 170 are formed, a gate dielectric 196 is formed, as illustrated by FIG. 19. Forming the gate dielectric may include depositing a layer of oxide, oxynitride, a hafnium-based high-k dielectric, or other appropriate materials. The gate dielectric 196 may be formed along the walls 184 and 186 of the fins 178 and the top of the base 176 (FIG. 18). In some embodiments, a portion or all of the gate dielectric 196 may be removed from the top of the rows 170, or the gate dielectric 196 may be left on the top of the rows 170.

Figure 20:
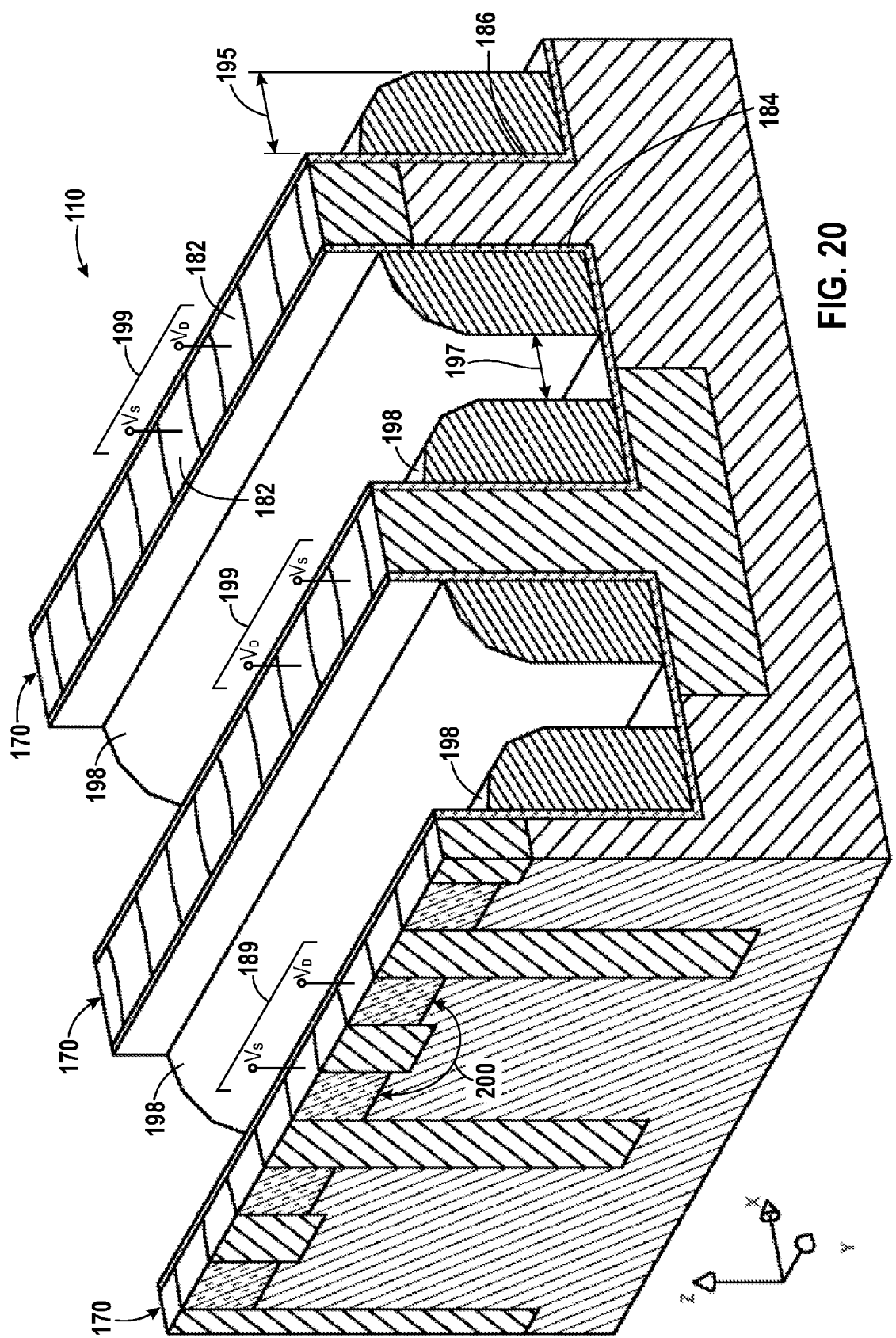

Next, gates 198 are formed, as illustrated by FIG. 20. The gates may be made of metal, doped polysilicon, TiN, or other appropriate conductive materials. In this embodiment, the gates 198 are formed by depositing a blanket film of the gate material and anisotropically etching the gate material to leave side-wall spacers of gate material. The illustrated gates 198 extend along the sides of the rows 170 so that they overlap both the bottom of the gaps 180 and the upper doped layer 112 of the substrate 110 that form the distal portion of the legs 182. In some embodiments, the gates 198 may have a width 195 that is generally equal to or less than 0.5 F, and they may be separated by a gap that is generally equal to 0.5 F.

At this stage of the manufacturing process, each of the illustrated fins 178 (FIGS. 17 and 18) constitutes a transistor 199 (FIG. 20). The two legs 182 (FIGS. 17 and 18) are a source and a drain, and the material adjacent the walls 184 and 186 of the fins 178 (FIGS. 17 and 18) form a channel, as illustrated by arrow 200 (FIG. 20), representing current flow through the transistor 199. To turn on the transistors 199, a voltage may be asserted on the gates 198, and a voltage between the source ($V_s$) and drain ($V_D$) may drive current 200 through the channel. The illustrated transistors 199 may be referred to as dual-gate transistors or multi-gate transistors, as they have a gate adjacent each wall 184 and 186 (FIGS. 17 and 18). The gates 198 may be energized according to a variety of patterns: both gates 198 on either side of a row 170 may be energized generally simultaneously; one gate 198 may be energized, but not the other; or the gates 198 may be energized independent of one another. In some embodiments, the gates 198 may partially or entirely circumscribe the rows 170, e.g., the gates 198 one either side of the rows 170 may connect at one or both ends of the rows 170.

A variety of devices may be connected to the transistors 199. For example, the transistors 199 may connect to other transistors 199 to form a processor, an application specific integrated circuit (ASIC), or static random access memory (SRAM), or the transistors may connect to a device specifically configured to store data, such as a capacitor or phase change memory. One example of a process that forms a memory device is illustrated by FIGS. 21-23.

Figure 21:
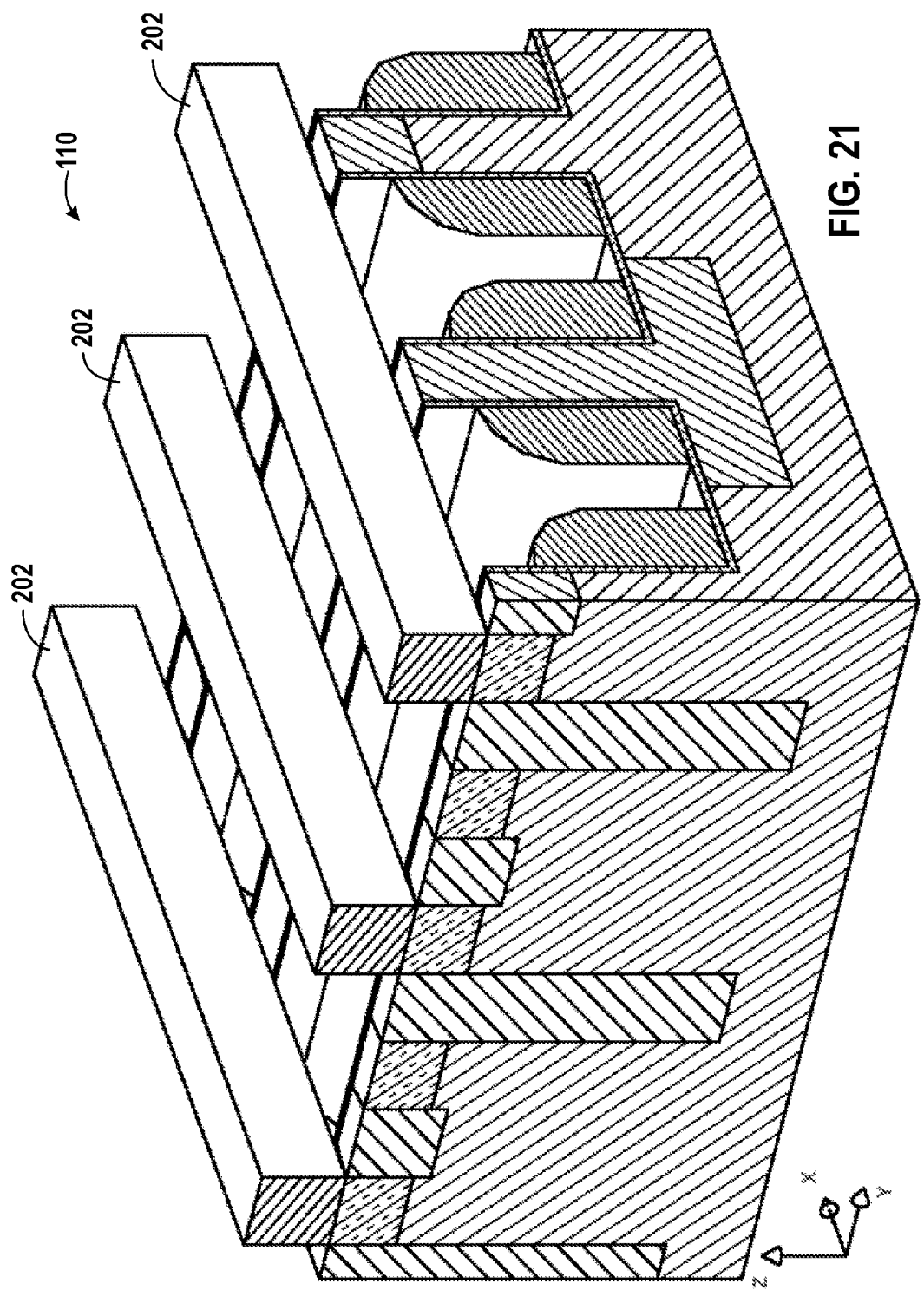

After forming the gates 198, the gates 198 may be insulated with a dielectric (not show to more clearly illustrate other features), and data lines 202 may be formed on this dielectric, as illustrated by FIG. 21. The data lines 202 may be formed with a process similar to the process that was used to pattern the rows 170. For instance, in one embodiment, the data lines 202 are formed by applying a film including a conductive material and patterning the film with a side-wall spacer mask similar to the one illustrated by FIG. 14, except oriented generally perpendicular to the side-wall spacers 166 of FIG. 14. The data lines 202 may generally align with one of the legs 182 of each of the fins 178. The data lines 202 may include a conductive material, such as doped polysilicon or metal.

Figure 22:
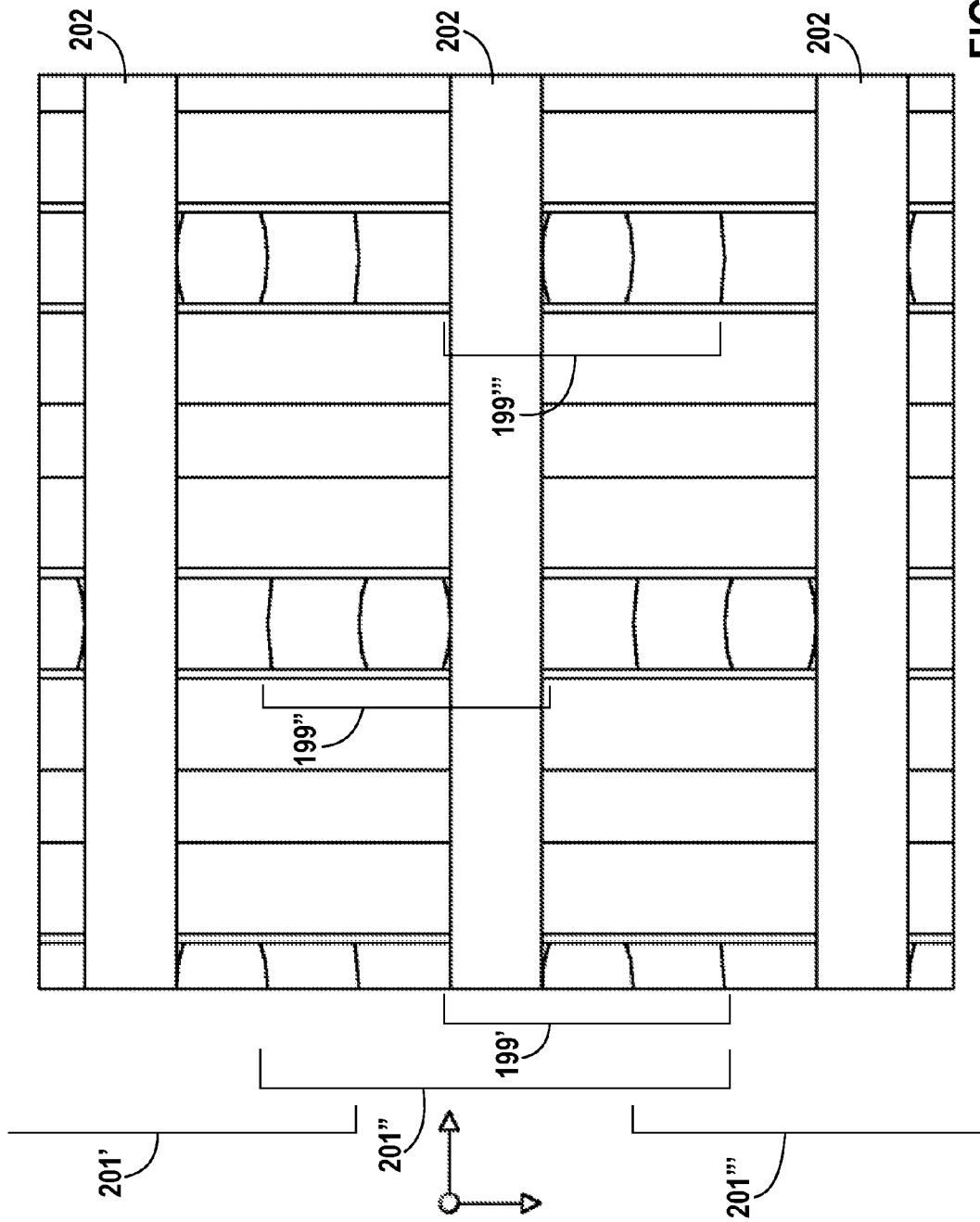
Figure 23:
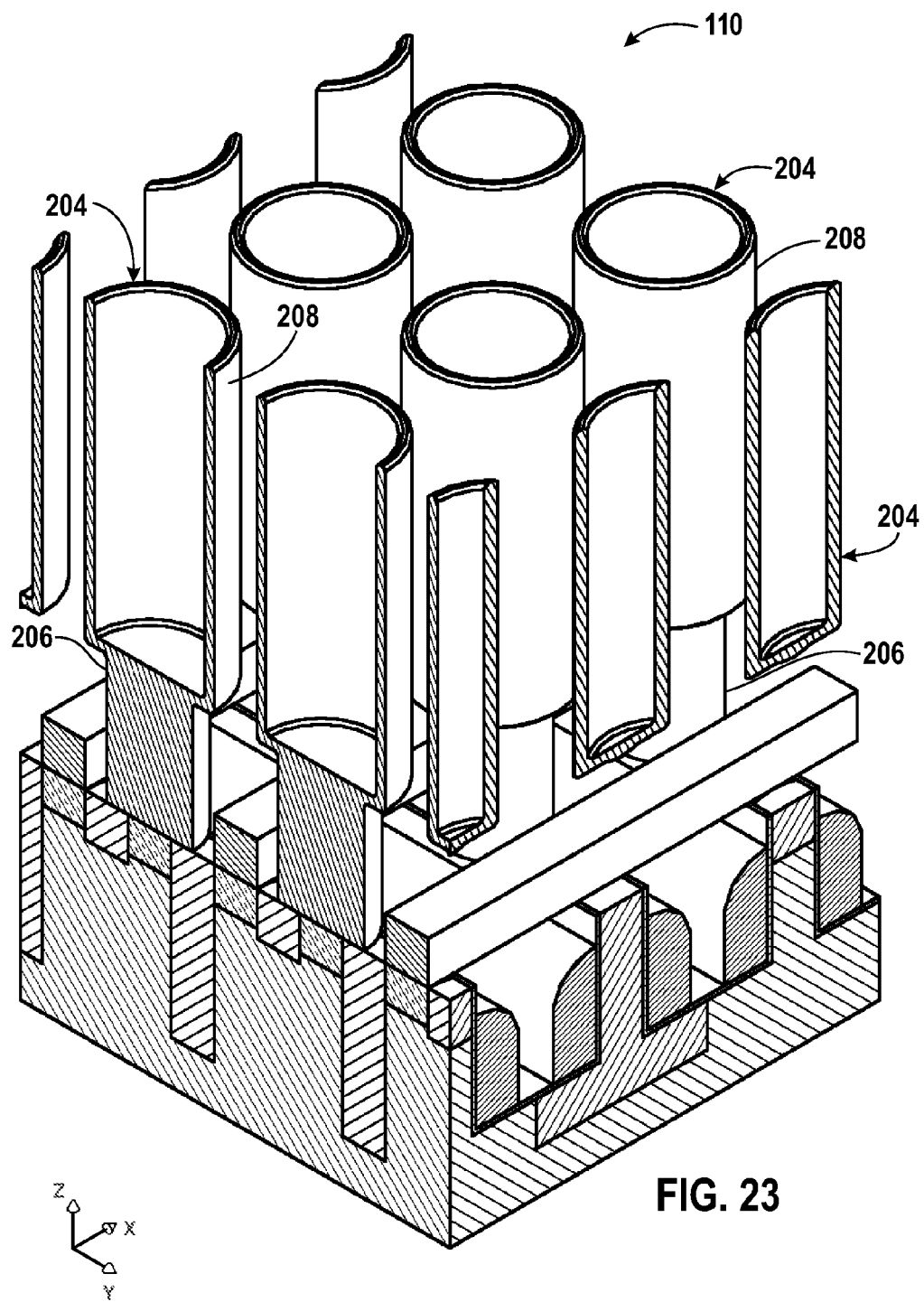

In this embodiment, the data lines 202 are generally or substantially straight and generally align with legs 182 on alternating sides of the fins 178, as illustrated by FIG. 21 and FIG. 22, which is a top view of the perspective illustrated by FIG. 21. The data lines 202, in this embodiment, are generally or substantially straight because the precursor pillars 138 are aligned with overlapping tubes 140, as illustrated by the dotted lines of FIG. 10. Generally or substantially straight data lines 202 are believed to reduce parasitic capacitance and resistance relative to data lines that undulate. In other embodiments, though, the data lines 202 may not be generally or substantially straight.

In the illustrated embodiment, the transistors 199 extend out under alternating sides of the data lines 202, as illustrated by FIG. 22. For example, the transistor 199" is on a different side of the data line 202 from the transistors 199' and 199''', which are adjacent the transistor 199" in the direction of the data lines 202. Together, the transistors 199', 199", and 199''' are part of a column 201", which is partially overlapped by adjacent columns 201' and 201'''. In other embodiments, the columns 201 may not overlap, and the transistors 199 may be on the same side of the data lines 202.

The other terminal of the transistors 199 may be connected to capacitor plates 204, as illustrated by FIG. 23. The capacitor plates 204 may each include a neck 206 and a cup 208. The necks 206 may connect the capacitors 204 to the source or drain of the transistors 199 via an exposed, top portion of one of the legs 182. To form capacitors, the capacitor plates 204 may be coated with both a dielectric and another conductive film. The second film may form another plate to create capacitors connected to the transistors 199.

In operation, each pair of a capacitor plate 204 and transistor 199 may cooperate to store data by accumulating a charge on the capacitor plates 204. To write data to a selected capacitor plate 204, the associated transistor 199 may be turned on by energizing its gate(s) 198 (FIG. 20), and current 200 may flow through the transistor 199 to or from the capacitor plate 204. The capacitor plates 204 may be addressed according to the combination of the gate(s) 198 and the data line 200 that connect to the transistor 199 associated with a given capacitor plate 204. In some embodiments, the gates 198 may be referred to as word lines, and the data lines 200 may be referred to as bit lines. To read data from a selected capacitor plate 204, the associated transistor 199 may be turned on, and the voltage of the data line 200 connected to the transistor 199 may be sensed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A data storage device, comprising:
a plurality of transistors each comprising a fin extending from a base and having a source and a drain separated from the source by a gap having two generally concave-curved side-walls; and
a plurality of capacitor plates each comprising a neck and a cup, wherein the neck of each respective capacitor plate is coupled to either the source or the drain of a respective one of the plurality of transistors.

2. The device of claim 1, wherein each capacitor plate is coated with a dielectric.

3. The device of claim 2, wherein the dielectric of each capacitor plate is further coated with a conductive film.

4. The device of claim 1, wherein each pair of a transistor of the plurality of transistors and a capacitor plate of the plurality of capacitor plates is configured to store data by enabling current to flow between the transistor and the capacitor plate.

5. The device of claim 1, wherein a pair of side-wall spacer gates is disposed on opposite sides of the fin.

6. The device of claim 5, wherein the pair of side-wall spacer gates overlap both the source and the drain.

7. The device of claim 1, wherein the source and the drain each comprise a first doped region and a portion of a second doped region.

8. The device of claim 1, wherein the gap is at least partially filled with a dielectric material.

9. The device of claim 1, wherein the source of the fin comprises a first planar wall, a second planar wall, a convex curved side wall, and a concave curved side wall.

10. The device of claim 9, wherein the drain of the fin comprises a third planar wall, a fourth planar wall, a second convex curved side wall, and a second concave curved side wall, and wherein the concave curved side wall and the second concave curved side wall form the gap.

11. The device of claim 1, wherein the gap defines a generally elliptical shape.

12. A data storage device, comprising:
an access device having a fin, wherein the fin comprises two legs separated by a gap having generally concave-curved side-walls; and
a storage device electrically coupled to one of the two legs.

13. The device of claim 12, wherein one of the two legs comprises a drain and the other of the two legs comprises a source of the access device.

14. The device of claim 12, wherein each of the two legs comprises one of the generally concave-curved side-walls and a respective convex-curved side wall.

15. The device of claim 14, wherein each of the two legs also comprises two planar side walls.

16. The device of claim 12, wherein the gap defines a generally elliptical shape.

17. The device of claim 12, wherein outer walls of the two legs define a generally elliptical shape.

18. The device of claim 12, wherein the storage device comprises a capacitor plate having a neck and a cup, wherein the neck is electrically coupled to one of the two legs.

19. The device of claim 12, wherein the storage device is formed over the access device.

20. A data storage device, comprising:
   a fin transistor comprising:
   a first leg comprising a first planar wall, a second planar wall, a convex curved side wall, and a concave curved side wall, wherein the first and second planar side walls are disposed opposite one another, and the convex curved side wall and the concave curved side wall are disposed opposite one another; and
   a second leg separated from the first leg by a gap and comprising a third planar side wall, a fourth planar side wall, a second convex curved side wall, and a second concave curved side wall, wherein the third and fourth planar side walls are disposed opposite one another, the second convex curved side wall and the second concave curved side wall are disposed opposite one another; and
   a storage device electrically coupled to one of the first leg or the second leg.

21. The device of claim 20, wherein the concave curved side wall and the second concave curved side wall form the gap.

22. The device of claim 20, wherein the gap devices a generally elliptical shape.

23. The device of claim 20, wherein the first leg comprises a source of the fin transistor and wherein the second leg comprises a drain of the fin transistor.

24. The device of claim 20, wherein the storage device comprises a capacitor plate having a neck and a cup, wherein the neck is electrically coupled to one of the first leg or the second leg.

25. The device of claim 20, wherein the fin transistor comprises a base portion having a generally elliptical shape.

* * * * *